United States Patent [19]
Yamamoto et al.

[11] Patent Number: 5,313,155
[45] Date of Patent: May 17, 1994

[54] DRIVING APPARATUS FOR CROSS-COIL TYPE ANALOG INDICATING INSTRUMENT HAVING REDUCED RIPPLE

[75] Inventors: Tomohisa Yamamoto; Hiroyuki Ban, both of Aichi, Japan

[73] Assignee: Nippondenso Co., Ltd., Kariya, Japan

[21] Appl. No.: 885,730

[22] Filed: May 19, 1992

[30] Foreign Application Priority Data

May 27, 1991 [JP] Japan ................... 3-152528

[51] Int. Cl.$^5$ .................... G01R 11/36; G01P 3/48
[52] U.S. Cl. ............................. 324/143; 324/166
[58] Field of Search .......... 324/143, 144, 146, 140 R, 324/166

[56] References Cited

U.S. PATENT DOCUMENTS 4,988,944 1/1991 Ito .

FOREIGN PATENT DOCUMENTS 272965 6/1988 European Pat. Off. .
2231513 1/1974 Fed. Rep. of Germany .
3430711 11/1985 Fed. Rep. of Germany .
1118772 5/1989 Japan .
2222840 9/1990 Japan .

Primary Examiner—Walter E. Snow
Attorney, Agent, or Firm—Cushman, Darby & Cushman

[57] ABSTRACT

A driving apparatus used for an analog indicating instrument having a pair of cross coils comprises a pulse signal generating device for generating a pulse signal having a frequency proportional to a quantity to be measured, a frequency-voltage conversion device for generating a ripple voltage proportional to the frequency of the pulse, holding a mean voltage of the ripple voltage as an analog voltage while restraining the ripple, and controlling the analog voltage so as to change following a mean value of the ripple voltage, thereby to supply the analog voltage, and driving devices for supplying a current in accordance with the analog voltage to the cross coils so as to drive these cross coils. The driving apparatus has effects on improving responsibility of frequency-voltage conversion operation in a low frequency region and reducing the deflection of a pointer of an instrument by restraining the ripples.

8 Claims, 17 Drawing Sheets

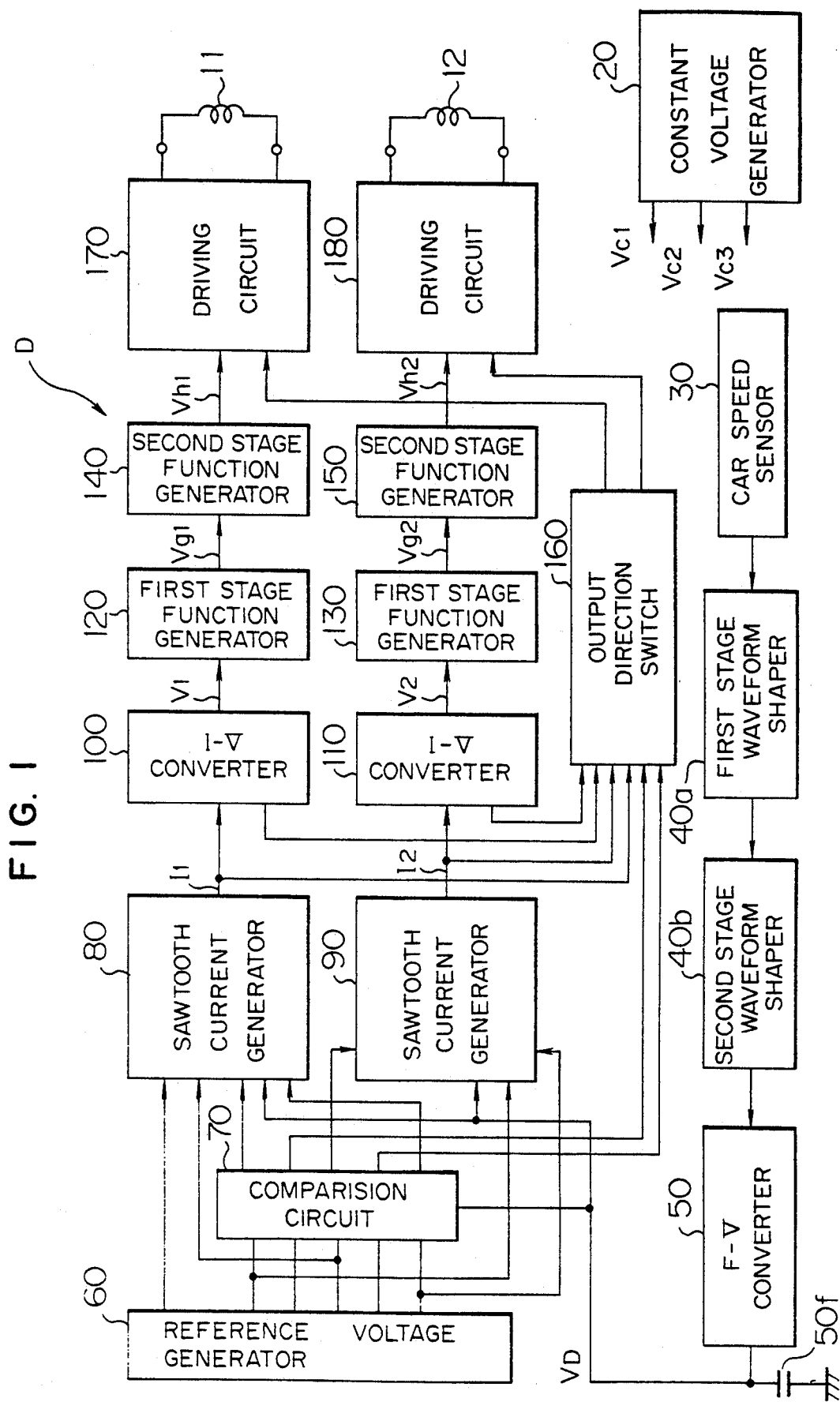
FIG. I

F I G. 10A
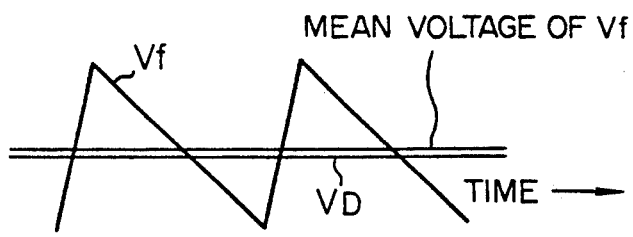
F I G. 10B
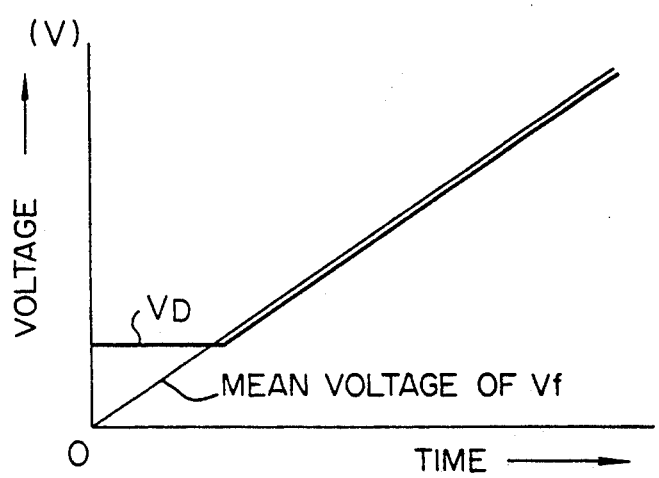
F I G. 10C
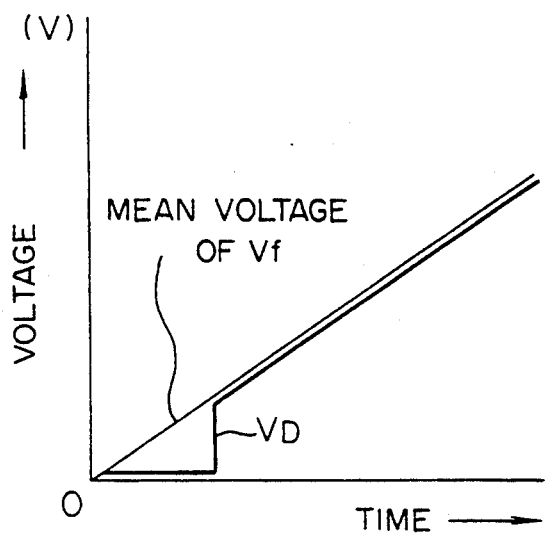

DRIVING APPARATUS FOR CROSS-COIL TYPE ANALOG INDICATING INSTRUMENT HAVING REDUCED RIPPLE

BACKGROUND OF THE INVENTION

1. Field of the Invention

The present invention relates to a cross coil type analog indicating instrument and more particularly to a driving apparatus suited for driving the analog indicating instrument concerned.

2. Description of the Related Arts

In a driving apparatus of this type has been heretofore normally furnished with a frequency-voltage converter for converting a car speed into analog voltage. The frequency-voltage converter receives a signal having a frequency proportional to a car speed generated by a car speed pickup and converts the signal into an analog voltage proportional to the frequency. And the analog voltage supplies cross coils with an electric current so as to drive them, thereby to indicate the car speed by a pointer coupled with the cross coils.

In such a structure, ripple components are usually contained in the analog voltage outputted from above-mentioned frequency-voltage converter. Since these ripple components are conspicuous particularly in a low frequency region, such a problem is posed that large pointer deflection phenomenon presents itself on the pointer.

In regard to the above, it is conceivable to adopt a smoothing capacitor having large electrostatic capacity for increasing smoothing degree of the ripple components, thereby to restrain above-mentioned large pointer deflection phenomenon. In such a case, however, instead of a fact that large pointer deflection phenomenon in a low frequency region can be restrained, above-mentioned smoothing causes delay in response in the output of the frequency-voltage converter, and the pointer cannot deflect with good responsibility following kaleidoscopic change of the car speed. As a result, such a problem is posed that correct car speed information cannot be brought to a crew.

While a smaller electric capacity of the capacitor may improve the responsibility by reducing the smoothing degree of ripple components, the capacitor cannot dissolve the pointer deflection phenomenon in the low frequency region. As a result, such a problem is posed that visual confirmation of speed information is not easy.

Kobayashi et al. disclose a driving apparatus by a digital circuit which generates an instrument driving signal having a suitable time constant by using a frequency-voltage (F-V) converter section selected in accordance with a frequency of an input pulse in JP-A-1-118772. It is also conceivable that above-mentioned frequency-voltage converter is structured with a digital circuit as disclosed by Kobayashi et al., but the frequency-voltage converter becomes larger in size and higher in cost.

Further, according to an apparatus for driving a pointer in accordance with a trapezoidal waveform stored in advance corresponding to an input signal level, the deflection of a pointer caused by ripples is eliminated, but the deflection caused by a point of inflection of the trapezoidal waveform is generated. The present inventors have disclosed in JP-A-2-222840 driving means which generates a triangular wave in accordance with an analog input, and supplies the triangular wave to the cross coils after having the triangular wave approximate to a sine wave. With this, the deflection of the pointer becomes smooth, but responsibility in a low frequency region is insufficient.

SUMMARY OF THE INVENTION

It is an object of the present invention to provide for solving above-mentioned subjects a driving apparatus for a cross coil type analog indicating instrument having good responsibility of indication by a pointer while restraining a pointer deflection phenomenon of a pointer to the minimum by securing both high responsibility of frequency-voltage conversion operation in a low frequency region and restraint of ripples.

A driving apparatus of the present invention is applied to an analog indicating instrument provided with a pair of cross coils arranged while crossing almost concentrically with each other and generating electromagnetic force in accordance with respective inflow currents corresponding to a process quantity and a pointer indicating the process quantity with a deflection angle corresponding to a composite value of respective electromagnetic forces, and the apparatus comprises a pulse generating means for generating pulse signals in consecutive order at a frequency proportional to the process quantity, a frequency-voltage conversion means for converting respective pulse signals into analog voltage proportional to the frequency of these respective pulse signals, and a driving means for driving the respective cross coils by applying the respective inflow currents to these respective cross coils. The apparatus is characterized wherein the frequency-voltage conversion means is composed of a voltage forming means for forming ripple voltage proportional to the frequency of respective pulse signals, a hold means for holding a mean voltage of the above-mentioned ripple voltage as the analog voltage while restraining the ripple thereof, and a voltage control means for controlling the analog voltage so as to change following in the wake of the change of the mean value of the ripple voltage.

With the structure of the present invention described above, when the pulse signal generating means generates pulse signals having the frequency proportional to the process quantity in consecutive order, in the frequency-voltage conversion means, the voltage forming means forms ripple voltage proportional to the frequency of respective pulse signals, the hold means holds the mean voltage of the above-mentioned ripple voltage as an analog voltage while restraining the ripple thereof, the voltage control means controls the analog voltage so as to change following in the wake of the change of the mean value of the ripple voltage, the driving means drives respective cross coils so as to apply respective inflow currents in accordance with the above-mentioned controlled analog voltage, the respective cross coils produce electromagnetic force in accordance with respective inflow currents, and the pointer indicates the analog input with the deflection angle in accordance with the composite value of the above-mentioned electromagnetic force.

In such a case, the frequency-voltage conversion means controls to convert respective pulse signals into analog voltage proportional to respective frequencies and following in the wake of above-mentioned analog input with high responsibility and having only small ripples, as described above by means of the voltage forming means, the hold means and the voltage control means. Therefore, respective inflow currents to respective cross coils also become the current following in the wake of above-mentioned analog input with high responsibility similarly to the above and having small ripples. As a result, even in a range of small analog input, it is possible to substantially restrain the pointer deflection phenomenon and remarkably improve responsibility of the pointer to the change of analog input. Further, since the frequency-voltage conversion means can be structured by analog circuits without a digital circuit, cost increase will never be incurred.

BRIEF DESCRIPTION THE DRAWINGS

FIG. 1 is a block diagram showing an embodiment of the present invention;

FIG. 10A is a diagram showing the mean of the ripple voltage of the hold voltage when the offset voltage is set to $\frac{1}{2}$ of the ripple voltage;

FIG. 10B is a diagram showing a regression error when the offset voltage is $\frac{1}{2}$ of the ripple voltage;

FIG. 10C is a diagram showing a regression error when a low frequency cutoff circuit is used;

DESCRIPTION OF THE PREFERRED EMBODIMENTS

Figure 2A:
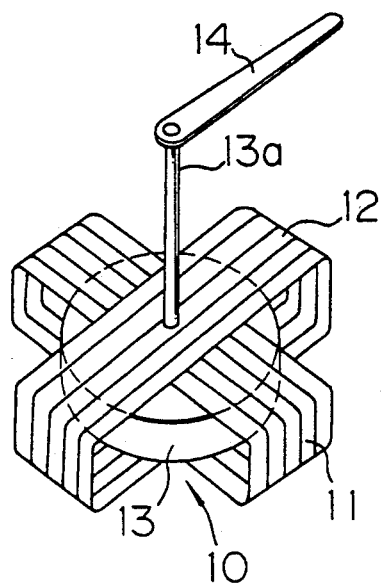
FIG. 2 is a schematic structural view of a cross coil type analog indicating instrument.
FIG. 2B is a detailed circuit diagram of a constant voltage generator shown in FIG. 1.

An embodiment of the present invention will be described hereinafter with reference to the drawings. FIG. 1 shows an embodiment in which the present invention is embodied to a driving apparatus D for an analog indicating mechanism 10 using cross coils shown in FIG. 2A. The analog indicating mechanism 10 has a pair of cross coils 11 and 12, and these respective cross coils 11 and are wound around so as to crosswise intersect each other. The cross coil 11 generates electromagnetic force in the axial direction thereof as a vector value in accordance with the inflow current. On the other hand, the cross coil 12 generates electromagnetic force as a vector value in the axial direction thereof which meets at right angles with the axis of the cross coil 11 in accordance with the inflow current.

Inside both cross coils 11 and 12, a disc 13 composed of a permanent magnet is supported rotatably on a shaft 13a thereof so as to meet at right angles with respective axes of both cross coils 11 and 12. This disc is magnetized to form an N pole and an S pole at respective outer peripheral portions on one diameter line thereof, respectively, and generates a predetermined magnetic force in a direction determined by the magnetized polarity in a vector value. The disc 13 rotates clockwise or counterclockwise by the predetermined magnetic force in accordance with the vector sum of respective electromotive force from both cross coils 11 and 12. A pointer 14 is supported on the shaft meeting at right angles with the shaft 13a of the disc 13, and a deflection angle S of this pointer 14 changes in accordance with the rotation of the disc 13.

Figure 2B:
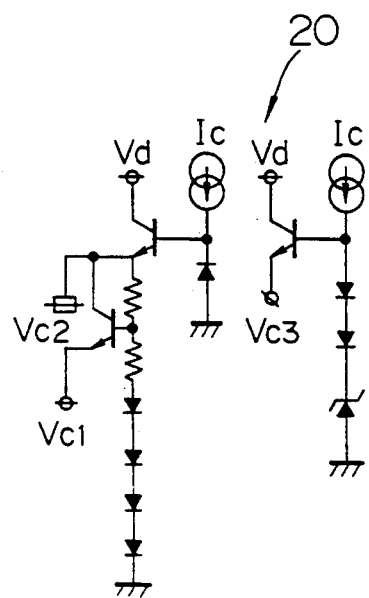

A driving apparatus D includes a constant voltage generator 20 as shown in FIG. 1. This constant voltage generator 20 has such a structure as shown in FIG. 2B, and generates respective constant voltages $Vc_1$, $Vc_2$ and $Vc_3$ based on d.c. voltage Vd from a d.c. power source (not shown) and constant current from a constant current source Ic. Further, the driving apparatus D is provided with a car speed sensor 30, a first stage waveform shaper 40a connected to the car speed sensor 30, a second stage waveform shaper 40b and a frequency-voltage or F-V converter 50 forming a principal part of the present invention as shown in FIG. 1, and the car speed sensor 30 detects an actual car speed V of the vehicle concerned and generates car speed pulses in consecutive order at a frequency f (Hz) proportional to the car speed V. The first stage waveform shaper 40a shapes waveforms of respective car speed pulses from the car speed sensor 30 and generates rectangular pulses (see FIG. 8(A)) in consecutive order.

Figure 3:
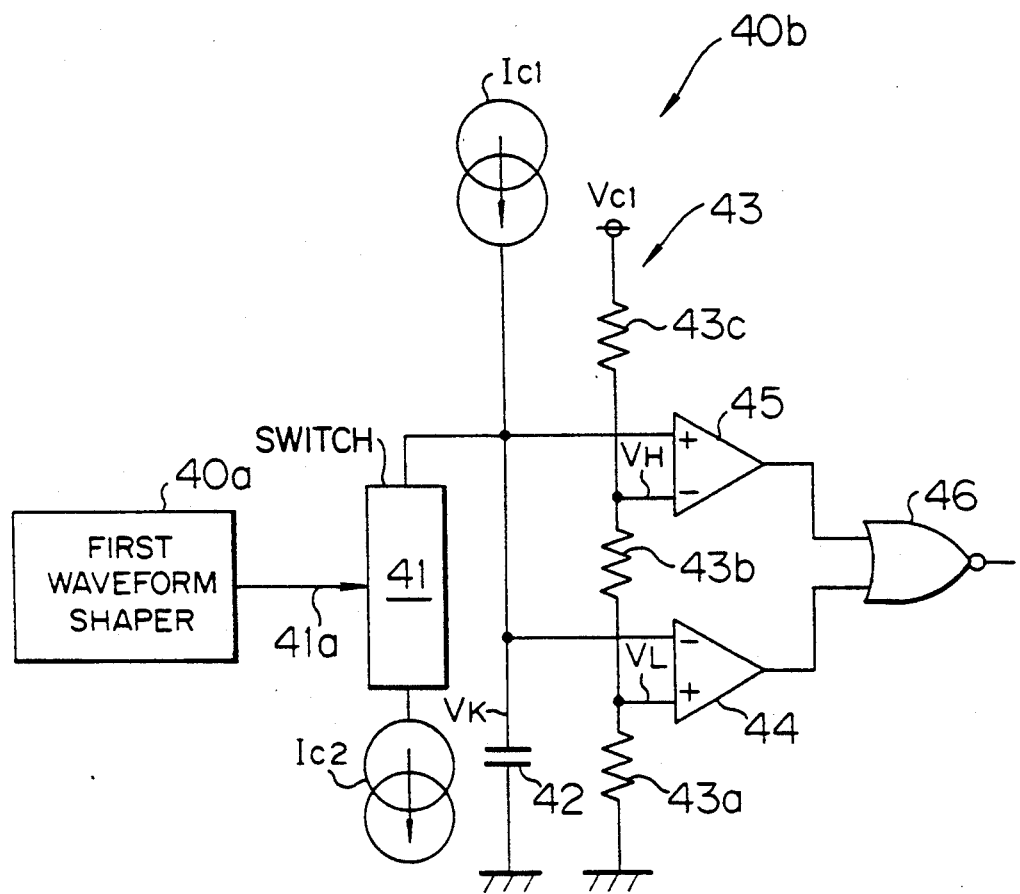
FIG. 3 is a detailed circuit diagram of a waveform shaper connected to an F-V converter shown in FIG. 1.
Figure 4:
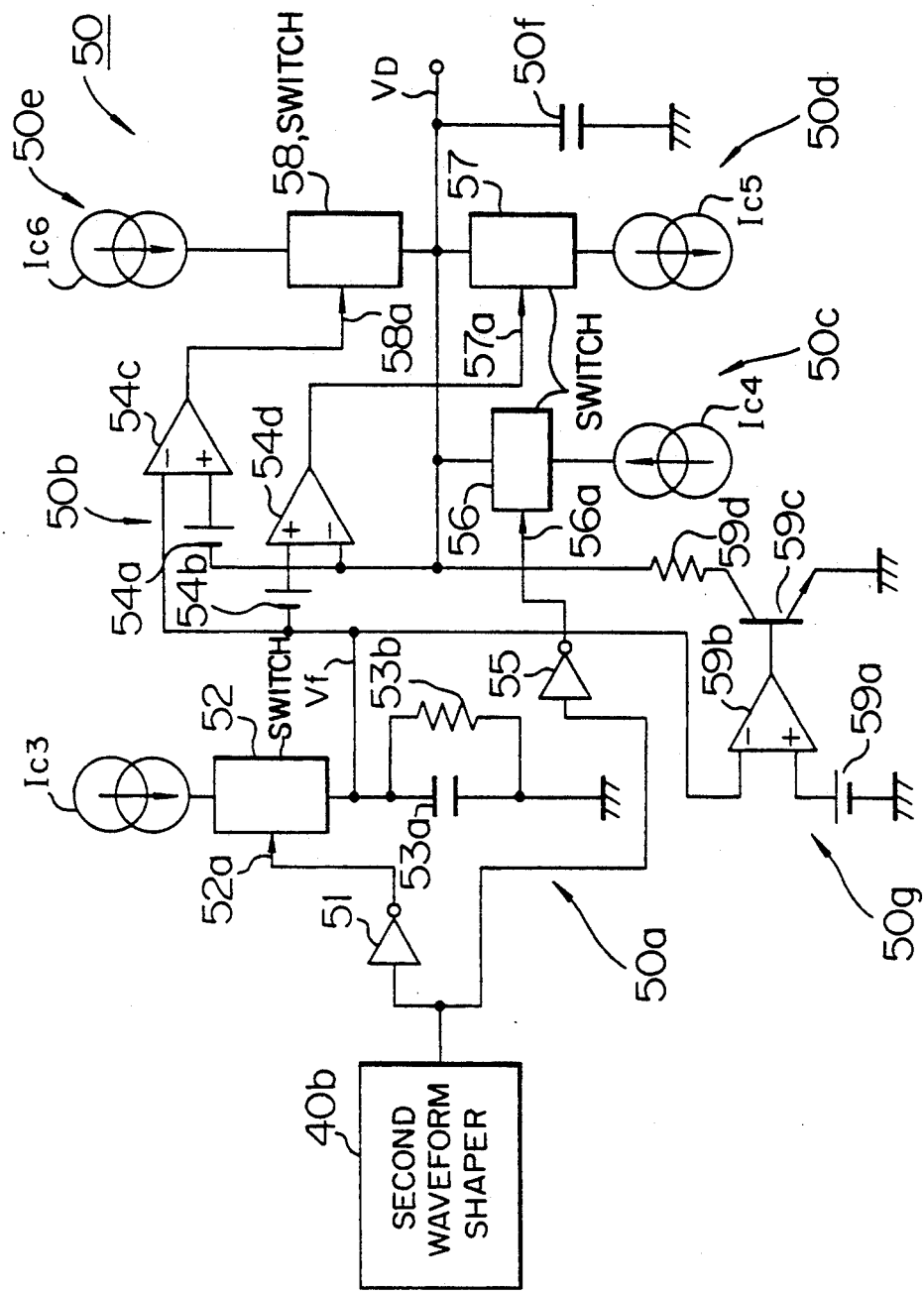
FIG. 4 is a detailed circuit diagram of the F-V converter shown in FIG. 1.

The second stage waveform shaper 40b includes an analog switch 41 as shown in FIG. 3, and this analog switch 41 is connected to the output terminal of the first waveform shaper 40a at a gate terminal 41a thereof. Further, this analog switch 41 is opened and closed in response to rise and fall of respective rectangular pulses from the first waveform shaper 40a, respectively.

Figure 8:
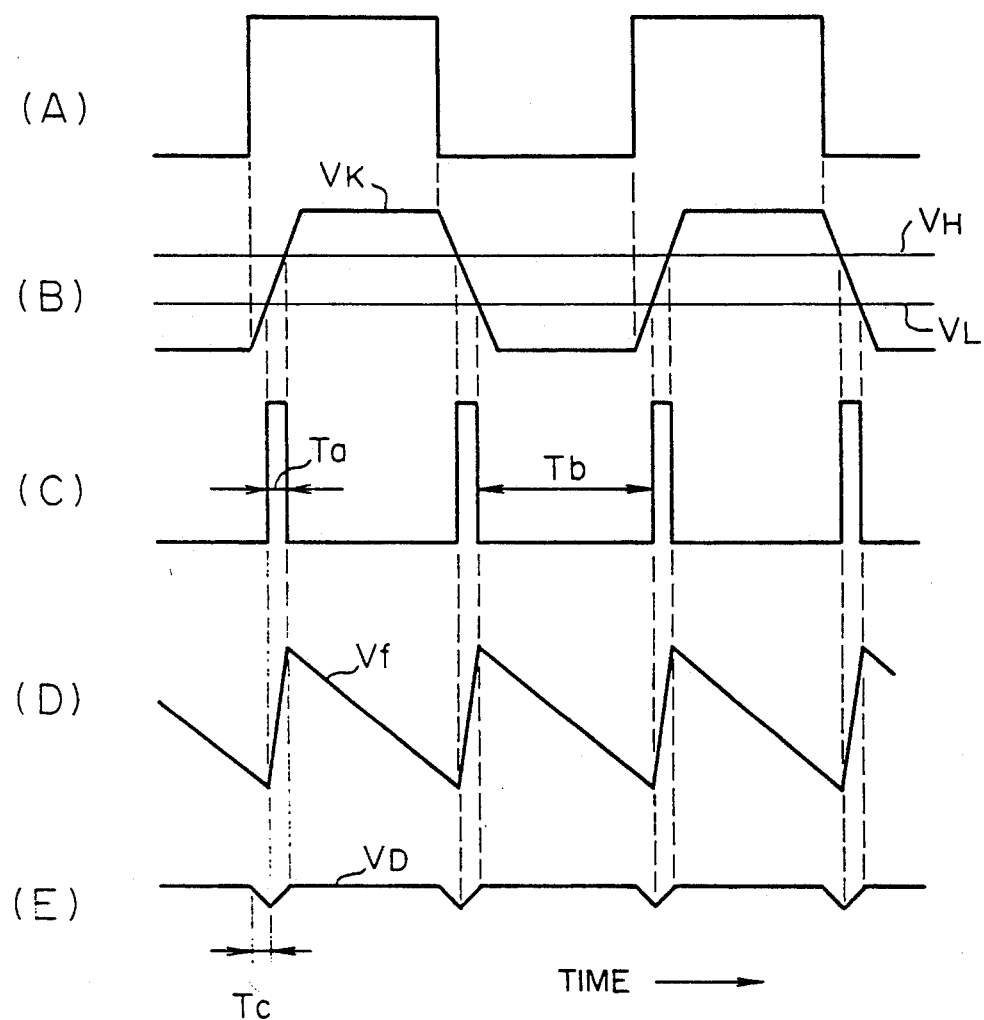
FIG. 8 is an output waveform diagram of principal components in the waveform shaper shown in FIG. 3 and the F-V converter shown in FIG. 4.

A capacitor 42 is connected to ground at one terminal and connected to a constant current source $I_{c1}$ and the analog switch 41 at the other terminal. The capacitor 42 receives a constant current from the constant current source $I_{c1}$ and is charged until it is saturated when the analog switch 41 is opened, and discharges to the ground voltage through the analog switch 41 through a constant current source $Ic_2$ connected thereto when the analog switch 41 is closed. In such a case, a terminal voltage Vk of the capacitor 42 increases in response to the rise of respective rectangular pulses (see FIG. 8(A)) from the first stage waveform shaper 40a and decreases in response to the fall of respective rectangular pulses from the first waveform shaper 40a as shown in FIG. 8(B). When it is assumed that a current of the constant current source $Ic_2$ is two times as large as the current of the constant current source $I_{c1}$, the increase rate is equal to the decrease rate.

A voltage dividing circuit 43 is composed of respective resistances 43a, 43b and 43c connected in series with each other. This voltage dividing circuit 43 divides a constant voltage $Vc_1$ from the constant voltage circuit 20 by respective resistances 43a, 43b and 43c, provides a divided voltage $V_L$ from a common terminal of the resistances 43a and 43b, and provides another divided voltage $V_H$ from a common terminal of the resistances 43b and 43c. Here, the divided voltage $V_H$ is higher than the divided voltage $V_L$, and both of these respective divided voltages $V_H$ and $V_L$ are situated between the highest level and the lowest level of the terminal voltage $V_K$ of the capacitor 42 (see FIG. 8(B)).

A comparator 44 compares the terminal voltage $V_K$ from the capacitor 42 with the divided voltage $V_L$ from the voltage dividing circuit 43, and generates a comparison signal of a high level when the terminal voltage $V_K$ is lower than the divided voltage $V_L$ and a comparison signal of a low level when $V_K$ is higher than $V_L$. On the other hand, a comparator 45 compares the terminal voltage $V_K$ from the capacitor 42 with the divided voltage $V_H$ from the voltage dividing circuit 43, and generates a comparison signal having a high level when the terminal voltage $V_K$ is higher than the divided voltage $V_H$ and a comparison signal of a low level when $V_K$ is lower than $V_H$.

A NOR gate 46 generates a gate signal of a high level when both of respective comparison signals from both comparators 44 and 45 are at a low level. Further, when at least one of respective comparison signals from both comparators 44 and 45 is at a high level, the NOR gate 46 generates a gate signal of a low level. In such a case, the level of the gate signal from the NOR gate 46 changes as shown in FIG. 8(C). Further, respective periods of time corresponding to the high level width and the low level width of the gate signal from the NOR gate 46 are expressed by respective symbols Ta and Tb as shown in FIG. 8(C).

The F-V converter 50 is composed of a current smoothing circuit 50a connected to the second stage waveform shaper 40b, a comparison circuit 50b connected to this current smoothing circuit 50a, a charging circuit 50c connected to the second stage waveform shaper 40b, a charging circuit 50e and a discharging circuit 50d connected to the comparison circuit 50b, a holding capacitor 50f connected to ground at one end thereof and connected to the comparison circuit 50b, the charging circuits 50c and 50e and the discharging circuit 50d, and a low frequency cutoff circuit 50g connected to the current smoothing circuit 50a and the capacitor 50f.

The current smoothing circuit 50a includes a buffer 51 and an analog switch 52, and the analog switch 52 is connected to an output terminal of the NOR gate 46 of the waveform shaper 40b through the buffer 51 at a gate terminal 52a thereof. Then, the analog switch 52 receives respective gate signals from the NOR gate 46 in consecutive order through the buffer 51 as shaping signals and is closed in response to the rise or opened in response to the fall of these respective shaping signals.

A capacitor 53a is connected to ground at one end thereof, and connected on the other hand to a constant current source $I_{c3}$ at the other end thereof through the analog switch 52, and a resistance 53b is connected in parallel with the capacitor 53a. Further, the capacitor 53a receives a constant current from the constant current source $I_{c3}$ and is charged when the analog switch 52 is closed. This capacitor 53a is discharged through the resistance 53b when the analog switch 52 is closed.

In such a case, a terminal voltage produced between terminals of the capacitor 53a is equivalent to a voltage obtained by converting respective shaping signals from the second stage waveform shaper 40b into a ripple voltage Vf proportional to these respective frequencies, and changes as shown in FIG. 8(D). Besides, the capacitor 53a is charged during a time width Ta (see FIG. 8(C)) which is equivalent to the high level width of the gate signal from the NOR gate 46, and the capacitor 53a is discharged during a time width Tb (see FIG. 8(C)) which is equivalent to the low level width of the gate signal from the NOR gate 46.

The comparison circuit 50b is composed of two offset d.c. power sources 54a and 54b and two comparators 54c and 54d forming a window comparator. The offset d.c. power source 54a is connected to the isolated terminal of the capacitor 50f through the negative terminal thereof. On the other hand, the offset d.c. power source 54b is connected to a common terminal of the analog switch 52 and the capacitor 53a through the negative terminal thereof.

Further, the offset d.c. power source 54a generates an offset voltage $\Delta V_1$, while another offset d.c. power source 54b generates an offset voltage $\Delta V_2$. The offset voltage $\Delta V_1$ corresponds to predetermined acceleration of the vehicle concerned. The offset voltage $\Delta V_2$ is set at ½ of the maximum value of the ripple voltage Vf so that the mean voltage of the ripple voltage Vf from the current smoothing circuit 50a becomes equal to the hold voltage $V_D$ from the capacitor 50f in a region where the mean voltage exceeds ½ of the maximum value of the ripple voltage Vf.

An inverted input terminal of the comparator 54c is connected to the common terminal of the analog switch 52 and the capacitor 53a, and a non-inverted input terminal thereof is connected to a positive terminal of the offset power source 54a. Further, when the ripple voltage Vf from the current smoothing circuit 50a is lower than the sum $(\Delta V_1 + V_D)$ of the offset voltage $\Delta V_1$ of the offset d.c. power source 54a and the hold voltage $V_D$ which is held by the capacitor 50f, the comparator 4c generates a comparison signal having a high level, and when the ripple voltage $V_f$ is higher than the sum, the comparator 54c generates a comparison signal of a low level.

On the other hand, the inverted input terminal of the comparator 54d is connected to the isolated terminal of the capacitor 50f, and the non-inverted input terminal thereof is connected to a positive terminal of the offset d.c. power source 54b. Further, when the sum $(Vf + \Delta V_2)$ of the ripple voltage Vf from the current smoothing circuit 50a and the offset voltage $\Delta V_2$ of the offset d.c. power source 54b is higher than the hold voltage $V_D$ of the capacitor 50f, the comparator 54d generates a comparison signal having a high level and when the sum is lower than the hold voltage $V_D$, the comparator 54d generates a comparison signal having a low level.

The charging circuit 50c includes a buffer 55, an analog switch 56 and a constant current source $I_{c4}$. The analog switch 56 is connected to the output terminal of the NOR gate 46 of the second stage waveform shaper 40b at a gate terminal 56a through the buffer 55. Thus, the analog switch 56 receives respective gate signals from the NOR gate 46 through the buffer 55 in consecutive order as shaping signals, and is closed and opened in response to the rise and the fall of these respective shaping signals, respectively. The constant current source $I_{c4}$ charges the capacitor 50f through the analog switch 56 when the analog switch 56 is closed.

The discharging circuit 50d is provided with an analog switch 57 and a constant current source $I_{c5}$, and the analog switch 57 is connected to the output terminal of the comparator 54d at the gate terminal 57a thereof. Further, this analog switch 57 is closed and opened in response to a comparison signal at a high level and a low level from the comparator 54d, respectively. The constant current source $I_{c5}$ discharges the capacitor 50f through the analog switch 57 when the analog switch 57 is closed.

The charging circuit 50e includes an analog switch 58 and a constant current source $I_{c6}$, and the analog switch 58 is connected to the output terminal of the comparator 54c at the gate terminal 58a thereof. Further, this analog switch 58 is opened and closed in response to a comparison signal at a high level and a low level from the comparator 54c, respectively. The constant current source $I_{c6}$ charges the capacitor 50f through the analog switch 58 when the analog switch 58 is closed.

The capacitor 50f is charged by a constant current from the constant current source $I_{c4}$ through the analog switch 56 during the period Ta by means of the charging circuit 50c and by a constant current from the constant current source $I_{c6}$ through the analog switch 58 by means of the charging circuit 50e when the ripple voltage Vf is lower than $\Delta V_1 + V_D$, and generates the hold voltage $V_D$ (see FIG. 8(E)). The capacitor 50f is discharged by the discharging circuit 50d only during the time Tc when the ripple voltage Vf drops to be in relationship of $V_D \geq (Vf + \Delta V_2)$ (see FIG. 8(E)). And it is held during the time equivalent to (Tb−Tc).

When the output of the constant current source $I_{c4}$ of the charging circuit 50c is set smaller compared to the electrostatic capacity of the capacitance 50f, voltage increase during the time Ta becomes smaller and the time Tc becomes shorter, thus making it possible to reduce the ripple of the hold voltage $V_D$. This fact means that it is possible to remarkably reduce the hold voltage $V_D$ from the F-V converter 50 at time of low frequency input, i.e., the ripple as an analog voltage which is the final F-V conversion output of the F-V converter 50.

Figure 9A:
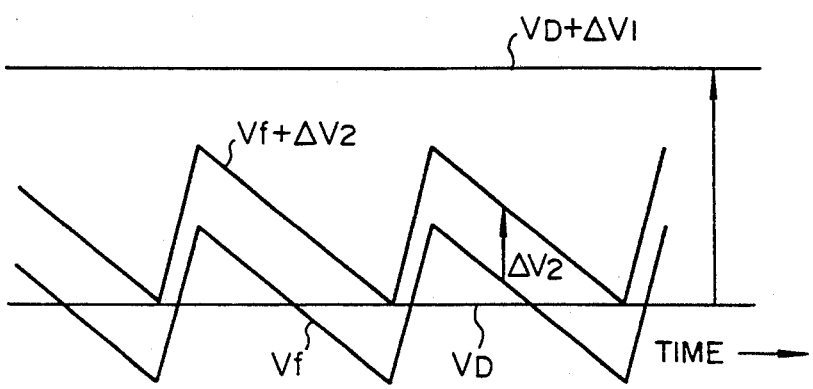
FIG. 9A is a waveform diagram showing the operation of the comparison circuit in the F-V converter shown in FIG. 4.

Furthermore, in the present embodiment, discharge from the capacitance is sustained when the hold voltage $V_D$ becomes equal to $Vf + \Delta V_2$ by means of the operation of the discharging circuit 50d. Thus, it is possible to maintain the relationship between the hold voltage $V_D$ and the ripple voltage Vf so that the hold voltage $V_D$ is made to coincide with respective lower ends of the waveform of the sum $(Vf + \Delta V_2)$ of the ripple voltage Vf and the offset voltage $\Delta V_2$ as shown in FIG. 9A.

The low frequency cutoff circuit 50g is composed of a threshold power source 59a, a comparator 59b, a transistor 59c and a resistance 59d. The threshold power source 59a is connected to ground at the negative terminal thereof, and this threshold power source 59a generates a threshold voltage at approximately ⅓ of above-mentioned offset voltage $\Delta V_2$ at the positive terminal thereof.

The comparator 59b is connected to a common terminal of the analog switch 52 and the capacitor 53a at the inverted input terminal thereof, and the non-inverted input terminal of this comparator 59b is connected to a positive terminal of the threshold power source 59a which generates the threshold voltage. Further, the comparator 59b generates a comparison signal of a low level when the ripple voltage Vf from the current smoothing circuit 50a is lower than the threshold voltage from the threshold power source 59a, and a comparison signal of a high level when the ripple voltage Vf is higher than the threshold voltage.

The emitter of the transistor 59c is connected to ground, the base of this transistor 59c is connected to the output terminal of the comparator 59b, and the collector of the transistor 59c is connected to the isolated terminal of the capacitor 50f through the resistance 59d. Further, the transistor 59c becomes conductive in response to the comparison signal of a high level from the comparator 59b, and non-conductive in response to the comparison signal of a low level. This fact means that the capacitor 50f is discharged through the transistor 59c when the transistor 59c is conducting, thereby to lower the hold voltage $V_D$ to zero (V).

Figure 9B:
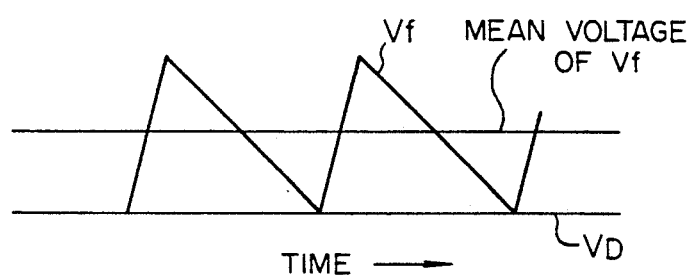
FIG. 9B is a diagram showing the mean of ripple voltage of the hold voltage when the offset voltage $\Delta V_2$ is equal to zero.
Figure 9C:
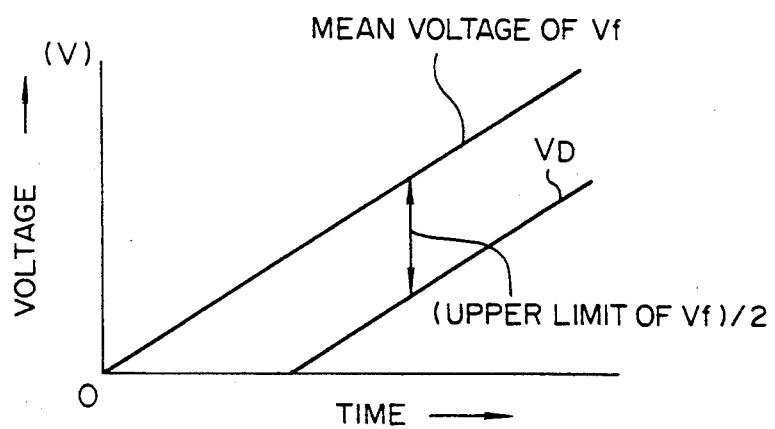
FIG. 9C is a diagram showing that the hold voltage maintains zero in a low frequency region.

Now, the basis of adopting the low frequency cutoff circuit 50g is as follows. When it is assumed tentatively that the offset voltage $\Delta V_2$ is zero, the hold voltage $V_D$ coincides with the lower limit value of the ripple voltage Vf at time of constant car speed of the vehicle concerned (see FIG. 9B). Accordingly, since the low limit value of the ripple voltage Vf becomes 0 V in the low frequency region until the mean value of the ripple voltage Vf reaches to ½ of the upper limit value of the ripple width of the ripple voltage Vf from zero (V), the hold voltage $V_D$ is maintained as it is zero (V) as shown as a dead region in FIG. 9C. Thus, the regression error in the low frequency region becomes larger. As a result, such a problem is posed that the following performance of the hold voltage $V_D$ is poor when the frequency proportional to the car speed is changed from zero (Hz).

Further, when the offset voltage $\Delta V_2$ is made equal to ½ of the upper limit value of the ripple width of the ripple voltage Vf, the mean voltage of the ripple voltage Vf and the hold voltage $V_D$ are in accord with each other in the region where the mean voltage of the ripple voltage Vf is at ½ or above of the ripple upper limit value of the ripple voltage Vf (see FIG. 10A). In the region where the mean voltage of the ripple voltage Vf is less than ⅛ of the ripple upper limit of the ripple voltage Vf, however, the hold voltage $V_D$ shows a constant voltage. Therefore, the regression error is still big when the frequency is zero (Hz) as shown in FIG. 10B.

Thus, the low frequency cutoff circuit 50g is adopted in order to dissolve the regression error in the region where the mean voltage of the ripple voltage Vf does not exceed ⅛ of the upper limit of the ripple width. With this, when the mean voltage of the ripple voltage Vf becomes below ⅛ of the upper limit value of the ripple width, the comparator 59b generates a comparison signal at a high level thereby to make the transistor 59c conducting, thus lowering the hold voltage $V_D$ to zero (V). As a result, the regression error with the frequency at zero (Hz) becomes zero (see FIG. 10C). Besides, the resistance 59d fulfills its duties to determine a discharge constant together with the capacitor 50f.

Figure 5:
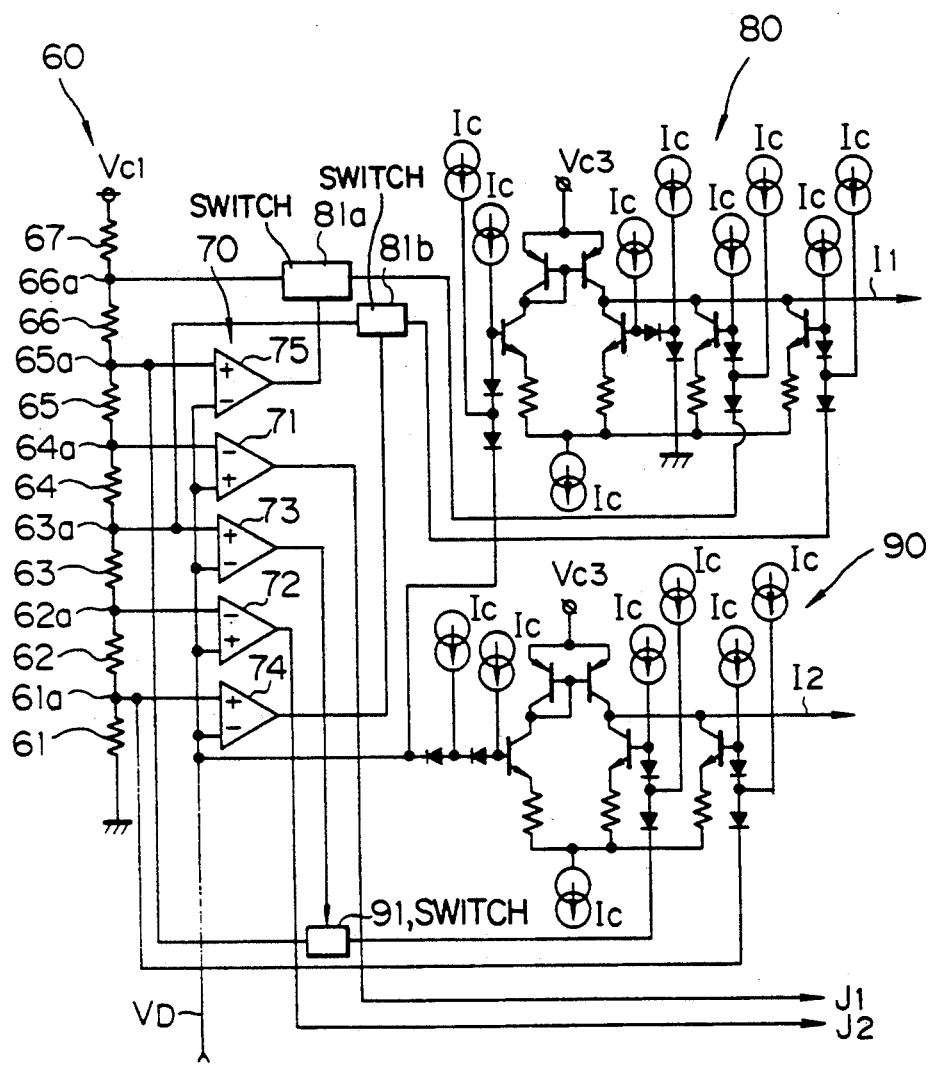
FIG. 5 is a detailed circuit diagram of a reference voltage generator, a comparison circuit, and two current generators shown in FIG. 1.

A reference voltage generator 60 divides the constant voltage $V_{C1}$ by means of respective resistances 61 to 67 connected in series with each other, and generates a first through a sixth reference voltages from respective common terminals 61a to 66a as shown in FIG. 5. In such a case, the first through the sixth reference voltages correspond to 0.5 (V), 0.75 (V), 1 (V), 1.25 (V), 1.5 (V) and 1.75 (V), respectively. Further, the range from 0° to 360° of the deflection angle S of the pointer 14 corresponds to from 0 (V) to 2 (V), and 0.5 (V), 1 (V) and 1.5 (V) correspond to 90°, 180° and 270°, respectively.

A comparison circuit 70 includes a plurality of comparators 71 to 75, and the comparator 71 compares the analog voltage $V_D$ from the F-V converter 50 with the fourth reference voltage at 1.25 V from the reference voltage generator 60. Then, the comparator 71 generates a comparison signal of a high level when the analog voltage $V_D$ is higher than the fourth reference voltage, than the reference voltage. The comparator 72 compares the analog voltage $V_D$ from the F-V converter 50 with the second reference voltage at 0.75 V from the reference voltage generator 60. Then, the comparator 72 generates a comparison signal of a high level when the analog voltage $V_D$ is higher than the second reference voltage, and a comparison signal of a low level when $V_D$ is lower than the second reference voltage.

The remaining comparators 73, 74 and 75 have hysteresis characteristics, and the comparator 73 compares the analog voltage $V_D$ from the F-V converter 50 with the third reference voltage at 1 V from the reference voltage generator 60. Then, the comparator 73 generates a comparison signal of a high level when the analog voltage $V_D$ is lower than the third reference voltage, and a comparison signal of a low level when $V_D$ is higher than the third reference voltage.

The comparator 74 compares the analog voltage $V_D$ from the F-V converter 50 with the first reference voltage at 0.5 V from the reference voltage generator 60. Then, the comparator 74 generates a comparison signal of a high level when the analog voltage $V_D$ is lower than the first reference voltage, and a comparison signal of a low level when it is not. The comparator 75 compares the analog voltage $V_D$ from the F-V converter 50 with the fifth reference voltage at 1.5 V from the reference voltage generator 60. Then, the comparator 75 generates a comparison signal of a high level when the analog voltage $V_D$ is lower than the fifth reference voltage, and a comparison signal of a low level when it is not.

A sawtooth current generator 80 of the first channel for the first cross coil includes a pair of analog switches 81a and 81b as shown in FIG. 5, and the analog switch 81a becomes conducting in response to the comparison signal of a high level from the comparator 75, and becomes non-conducting in response to the change to a low level of the comparison signal. Namely, the analog switch 81a becomes conducting when the analog voltage $V_D$ is at 1.5 V or higher and becomes non-conducting below 1.5 V. On the other hand, the analog switch 81b becomes conducting in response to the comparison signal of a high level from the comparator 74, and becomes non-conducting in response to the change to a low level of the comparison signal. Namely, the analog switch 81b becomes conducting when the analog voltage $V_D$ is at 0.5 V or higher and becomes non-conducting below 0.5 V. Then, the sawtooth current generator 80 generates a sawtooth current I1 (see FIG. 12A) in response to respective operations of both analog switches 81a and 81b, the F-V converter 50, the reference voltage generator 60 and the comparison circuit 70.

In such a case, the current generator 80 receives the sixth and the third reference voltages from the reference voltage generator 60 under a state that both analog switches 81a and 81b are conducting, and increases a current $I_1$ upto $+I_{1m}$ in proportion to the increase of the analog voltage $V_D$ from the F-V converter 50, decreases the current $I_1$ instantly down to $-I_{1m}$ in response to non-conduction of the analog switch 81b, increases the current $I_1$ from $-I_{1m}$ to $+I_{1m}$ in proportion to the increase of the analog voltage $V_D$, decreases instantly the current $I_1$ to $-I_{1m}$ again in response to non-conduction of the analog switch 81a, and increases $I_1$ upto $I_1=0$ in proportion to the increase of Vf.

A sawtooth current generator 90 of the second channel for the second cross coil includes an analog switch 91 as shown in FIG. 5. This analog switch 91 becomes conducting in response to a comparison signal of a high level from the comparator 73, and becomes non-conducting in response to the change to a low level of the comparison signal. Namely, the analog switch 91 becomes conducting when the analog voltage $V_D$ is at 1 V or higher and becomes non-conducting below 1 V. Then, the current generator 90 generates a sawtooth current I2 (see FIG. 12B) in accordance with respective operations of the analog switch 91, the reference voltage generator 60 and the F-V converter 50.

In such a case, the current generator 90 is applied with the first reference voltage from the reference voltage generator 60 and also applied with the fifth reference voltage in a state that the analog switch 91 is conducting, and increases a current $I_2$ from $-I_{2m}$ to $+I_{2m}$ in proportion to the increase of the analog voltage $V_D$ from the F-V converter 50, decreases the current $I_2$ instantly down to $-I_{2m}$ in response to non-conduction of the analog switch 91, and furthermore, increases the current $I_2$ from $-I_{2m}$ to $+I_{2m}$ in proportion to the analog voltage $V_D$.

Figure 6:
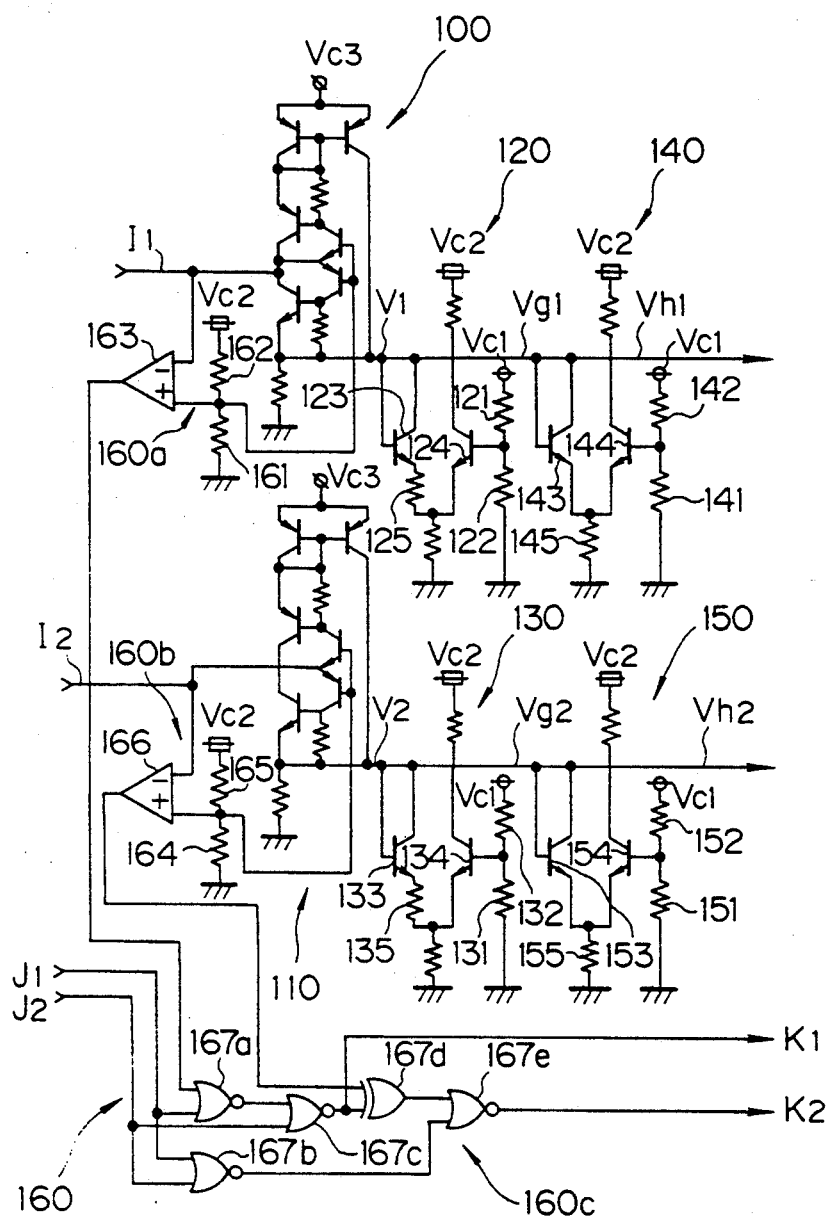
FIG. 6 is a detailed circuit diagram of two I-V converters, respective function generators and an output direction switch shown in FIG. 1.

A current-voltage or I-V converter 100 of the first channel receives the current $I_1$ from the current generator 80, and converts this current I into a triangular voltage $V_1$ (see FIG. 13A) as shown in FIG. 6. On the other hand, a current-voltage or I-V converter 110 of the second channel receives the current $I_2$ from the current generator 90 and converts this current $I_2$ into a triangular voltage $V_2$ (see FIG. 13B). In such a case, respective voltages $V_1$ and $V_2$ change to form triangular waveform in accordance with the increase of the analog voltage $V_D$.

A first stage function generator 120 for the first channel includes resistances 121 and 122 connected in series with each other, and these resistances 121 and 122 divides the constant voltage Vc from the constant voltage generator 20 and generates a divided voltage. Here, this divided voltage is equivalent to an analog voltage $V_D = V_{90-xb}$ corresponding to the deflection angle $S = 90° - xb = 46°$. Then, the first stage function generator 120 modifies the triangular wave voltage $V_1$ from the I-V converter 100 in relation to the divided voltage from resistances 121 and 122, and generates a function voltage $Vg_1$ (shown with a solid line in FIG. 13C).

In this case, $Vg_1$ has such a waveform that is bent rectilinearly at $Vf = V_{90-xb}$ and shows bilateral symmetry corresponding to lines of $Vf = 0.5$ and 1, respectively. In the first stage function generator 120, however, when it is assumed that respective base to emitter voltages of both transistors 123 and 124 are $V_{BE1}$ and $V_{BE2}$, a resistance value of a resistances 125 is R125, and a divided voltage by the resistances 121 and 122 is $V_A$, the current $i_1$ which is applied to the resistance 125 through the transistor 123 is specified by the following expression (1).

$$i_1 = (1/R125) \cdot (V_1 - V_{BE1} - V_A + V_{BE2}) \qquad (1)$$

Thus, the order of bending on the waveform of the function voltage $Vg_1$ is specified by this expression (1).

A first stage function generator 130 for the second channel includes resistance 131 and 132 connected in series with each other as shown in FIG. 6, and these resistances 131 and 132 divide the constant voltage $Vc_1$ from the constant voltage generator 20 so as to generate a divided voltage. Here, this divided voltage is equivalent to the analog voltage $V_D = V_{xb}$ corresponding to $S = xb = 44°$. Then, the first stage function generator 130 of the second channel for the second cross coil modifies the triangular wave voltage $V_2$ from the I-V converter 110 in relation to the divided voltage from both resistances 131 and 132 and generates a function voltage $Vg_2$ (shown with a solid line in FIG. 13D).

In such a case, $Vg_2$ has such a waveform that is bent rectilinearly at $Vf = V_{xb}$ and shows bilateral symmetry in respect to lines of $Vf = 0.5$ and 1, respectively. In the first stage function generator 130, the current applied to a resistance 135 through the transistor 133 is specified by the expression (1) essentially in a similar manner to the case of the first stage function generator 120 of the first channel in relation to respective base to emitter voltages of both transistors 133 and 134, the resistance value of the resistance 135 and the divided voltages of both resistances 131 and 132. Thus, the degree of bending on the waveform of the function voltage $Vg_2$ is also specified by the expression (1).

A second stage function generator 140 of the first channel for the first cross coil includes resistances 141 and 142 connected in series with each other, and these resistances 141 and 142 divide the constant voltage $Vc_1$ from the constant voltage generator 20 and generates divided voltage. Here, this divided voltage is equivalent to the analog voltage $V_D = V_{90-xa}$ corresponding to the deflection angle $S = 90° - xa = 71.9°$. Then, the second stage function generator 140 modifies the function voltage $Vg_1$ from the first stage function generator 120 in relation to the divided voltage from the resistances 141 and 142 and generates a function voltage $Vh_1$ (shown with a solid line in FIG. 13E).

In such a case, $Vh_1$ has such a waveform that bends rectilinearly at $Vf = V_{90-xa}$ and shows bilateral symmetry in respect to lines of $Vf = 0.5$ and 1, respectively. Here, when it is assumed in the second stage function generator 140 for the second channel that respective base to emitter voltages of both transistors 143 and 144 are $V_{BE3}$ and $V_{BE4}$, a resistance value of a resistances 141 and 142 is $V_B$, a current $i_2$ applied to the resistance 145 through the transistor 143 is specified by the following expression (2).

$$i_2 = \{(V_B - V_{BE4})/R145\} - I_S \cdot exp(q\sqrt{V_{BE4}/KT}) \qquad (2)$$

Thus, the degree of bending of the function voltage $Vh_1$ on a waveform different from that of $Vg_1$ is specified by this expression (2).

A second stage function generator 150 of the second channel for the second cross coil includes resistances 151 and 152 connected in series with each other as shown in FIG. 6, and these resistances 151 and 152 divide the constant voltage $Vc_1$ from the constant voltage generator 20 and generates a divided voltage. Here, this divided voltage is equivalent to an analog voltage $V_D = V_{xa}$ corresponding to the deflection angle $S = xa = 18.1°$. Then, the second stage function generator 150 modifies the function voltage $Vg_2$ from the first stage function generator 130 and generates a function voltage $Vh_2$ (shown with a solid line in FIG. 13F) in relation to the divided voltage from the resistances 151 and 152.

In such a case, $Vh_2$ has such a waveform that bends rectilinearly at $Vf = V_{xb}$ and shows bilateral symmetry in respect to lines of $Vf = 0.5$ and 1, respectively. In the second stage function generator 150, however, the current flowing into a resistance 155 through a transistor 153 is expressed by the expression (2) substantially in a similar manner to the case of the second stage function generator 140 of the first channel in relation to respective base to emitter voltages of both transistors 153 and 154, a resistance value of a resistance 155 and the divided voltage by the resistances 151 and 152. Thus, the order of bending of the function voltage $Vh_2$ on a waveform different from that of $Vg_2$ is specified by the expression (2).

An output direction switch 160 is composed of a comparison circuit 160a connected to the current generator 80 and the I-V converter 100 of the first channel, a comparison circuit 160b connected to the current generator 90 and the I-V converter 110 of the second channel, and a logical circuit 160c connected to respective comparison circuits 70, 160a and 160b. The comparison circuit 160a includes resistances 161 and 162 connected in series with each other, and these resistances divide the constant voltage $Vc_2$ from the constant voltage generator 20 and generates a divided voltage. Here, this divided voltage corresponds to ($Vc_2/2$). A comparator 163 generates a comparison signal of a high level when the voltage corresponding to the current $I_1$ from the first stage current generator 120 is lower than the divided voltage from both resistances 161 and 162, and generates a comparison signal of a low level when the voltage corresponding to the current $I_1$ is not lower than the divided voltage.

The comparison circuit 160b includes resistances 164 and 165 connected in series with each other, and these resistances 164 and 165 divide the constant voltage $Vc_2$ from the constant voltage generator 20 and generates a divided voltage. Here, this divided voltage corresponds to ($V_{c2}/2$). A comparator 166 generates a comparison signal of a high level when the voltage corresponding to the current $I_2$ from the current generator 90 of the second chain is lower than the divided voltage from resistances 164 and 165, and generates a comparison signal of a low level when the voltage corresponding to the current $I_2$ is not lower than the divided voltage.

The logical circuit 160c is composed of a NOR gate 167a connected to the two comparators 71 and 163, a NOR gate 167b connected to the comparators 71 and 72, a NOR gate 167c connected to the comparator 72 and the NOR gate 167a, an exclusive OR gate 167d connected to the comparator 166 and the NOR gate 167c, and a NOR gate 167e connected to the exclusive OR gate 167d and the NOR gate 167b. Then, this logical circuit 160c provides a first and a second output direction change-over signals on lines $K_1$ and $K_2$ from the NOR gates 167c and 167e, respectively, in accordance with the levels of the comparison signals from the comparators 71, 72, 163 and 166.

Incidentally, when it is assumed that the low level and the high level are expressed with "0" and "1", respectively, comparison signals from respective comparators 71, 72, 73, 74, 75, 163 and 166 are expressed with Ca, Cb, $Cs_1$, $Cs_2$, $Cs_3$, Csin and Ccos, respectively, the first output direction change-over signal from the NOR gate 167c is expressed with Dsin, and the second output direction change-over signal from the NOR gate 167e is expressed with Dcos, the following Table 1 is effected in relation to the deflection angle S.

TABLE 1

| S (degrees) | 0~90 | 90~180 | 180~270 | | | 270~360 |
|---|---|---|---|---|---|---|
| Voltage (V) | 0~0.5 | 0.5~0.75 | 0.75~1 | 1~1.25 | 1.25~1.5 | 1.5~2 |
| Ca | 0 | 0 | 0 | 0 | 1 | 1 |
| Cb | 1 | 1 | 0 | 0 | 0 | 0 |
| $Cs_1$ | 1 | 1 | 1 | 0 | 0 | 0 |
| $Cs_2$ | 1 | 0 | 0 | 0 | 0 | 0 |
| $Cs_3$ | 1 | 1 | 1 | 1 | 1 | 0 |
| Csin | 1 | 0 | 0 | 1 | 1 | 0 |
| Ccos | 0 | 1 | 1 | 0 | 0 | 1 |
| Dsin | 0 | 0 | 0 | 1 | 1 | 1 |
| Dcos | 1 | 0 | 0 | 0 | 0 | 1 |

Figure 7:
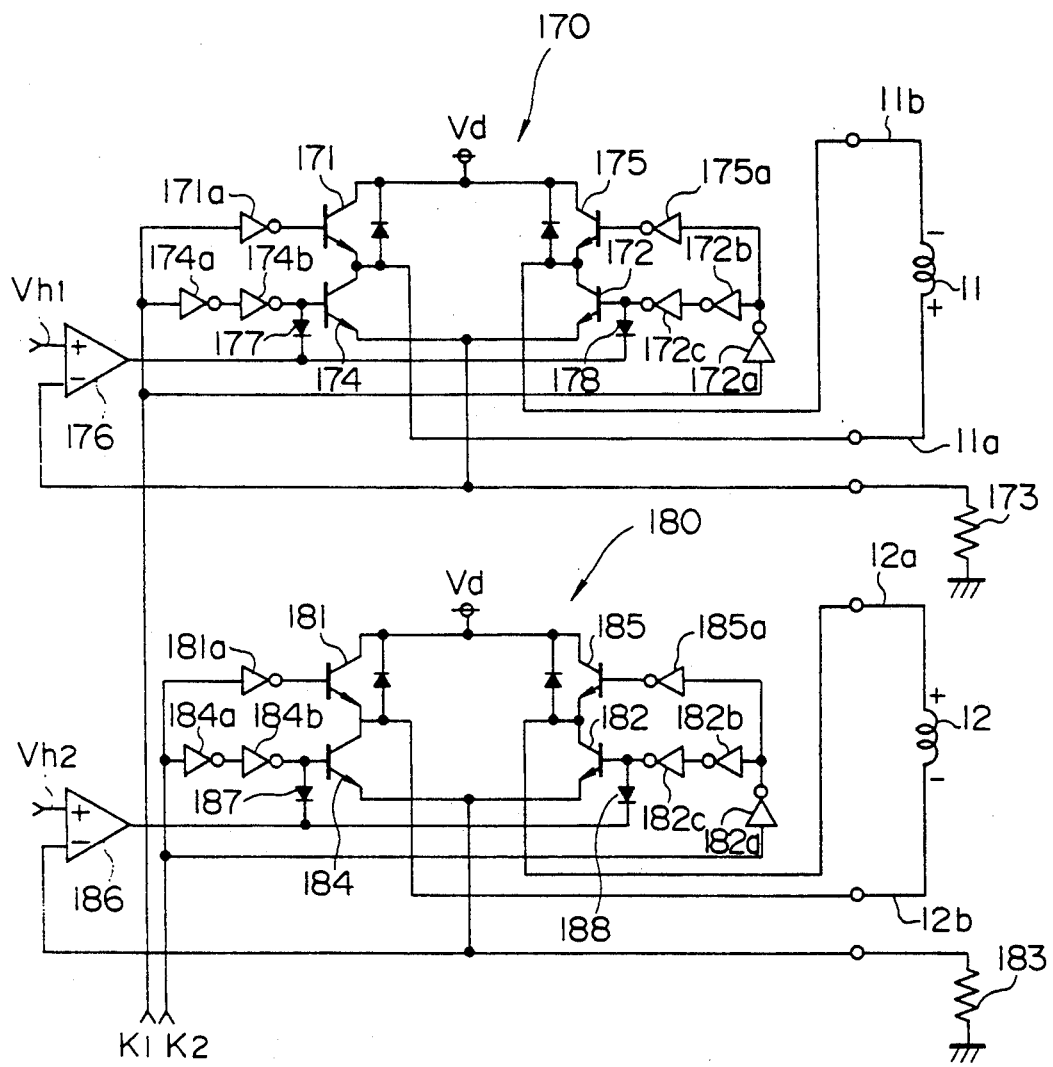
FIG. 7 is a detailed circuit diagram of two driving circuits shown in FIG. 1.

In a driving circuit 170 for the first cross coil 11, a transistor 171 undergoes an inverting operation of an inverter 171a and becomes conducting and a transistor 172 also undergoes an inverting operation of respective inverters 172a, 172b and 172c and becomes conducting when the first output direction change-over signal from the logical circuit 160c is at a low level as shown in FIG. 7. As a result, a current corresponding to (function voltage $Vh_1$/resistance value of resistance 173) flows into a resistance 173 through the transitor 171, the first cross coil 11 and the transistor 172.

On the other hand, when the first output direction change-over signal from the logical circuit 160c is at a high level, a transistor 174 undergoes respective inverting operations of two inverters 174a and 174b and becomes conducting, and a transistor 175 also undergoes inverting operations of two inverters 172a and 175a and becomes conducting. As a result, the current corresponding to (function voltage $Vh_1$/resistance value of resistance 173) flows into the resistance 173 through the transistor 175, the first cross coil 11 and the transistor 174.

This fact means that the first cross coil 11 generates electromagnetic force in a vector value determined by the inflow direction in accordance with the inflow current. In such a case, when both terminals of the first cross coil 11 are represented by respective symbols 11a and 11b as shown in FIG. 7, terminal voltage $V_{11}$ between the two terminals 11a and 11b is proportional to the inflow current into the first cross coil 11 and changes in a waveform as shown in FIG. 14(A) in relation to the analog voltage $V_D$.

An operational amplifier 176 differential amplifies two inputs so that a terminal voltage of the resistance 173 is provided equal to the function voltage $Vh_1$ from the second state function generator 140. Respective diodes 177 and 178 become conducting in response to the first output direction change-over signal from the NOR gate 167c, and becomes non-conducting in response to the change of the first output direction change-over signal to the low level. This fact means that respective transistors 174 and 172 become conductible only when respective diodes 177 and 178 are conducting.

On the other hand, in a driving circuit 180 of the second channel for the second cross coil 12, a transistor 181 undergoes inverting operation of an inverter 181a and becomes conducting and a transistor 182 also undergoes inverting operations of respective inverters 182a, 182b and 182c and becomes conducting when the second output direction change-over signal from the logical circuit 160c is at a low level. As a result, a current corresponding to (function voltage $Vh_2$/resistance value of resistance 183) flows into the resistance 183 through the transistor 181, the cross coil 12 and the transistor 182.

On the other hand, when the second output direction change-over signal from the logical circuit 160c is at a low level, a transistor 184 undergoes inverting operations by two inverters 184a and 184b and becomes conducting, and a transistor 185 also undergoes inverting operations of two inverters 182a and 185a and becomes conducting. As a result, the current corresponding to (function voltage $Vh_2$/resistance value of resistance 183) flows into the resistance 183 through the transistor 185, the second cross coil 12 and the transistor 184.

This fact means that the second cross coil 12 generates electromagnetic force in a vector value determined by the inflow direction in accordance with the inflow current. In such a case, when both terminals of the cross coil 12 are expressed by respective symbols 12a and 12b as shown in FIG. 7, a terminal voltage $V_{12}$ between the terminals 12a and 12b is proportional to the inflow current into the cross coil 12, and changes in a waveform such as shown in FIG. 14(B) in relation to the analog voltage $V_D$.

An operational amplifier 186 differential amplifies two inputs so that a terminal voltage of the resistance 183 is provided equal to the function voltage $Vh_2$ from the function generator 150. Respective diodes 187 and 188 become conducting in response to the second output direction change-over signal from the NOR gate 167e, and become non-conducting in response to the change of the second output direction change-over signal to a low level. This fact means that respective transistors 184 and 182 become conductible only in a state that respective diodes 187 and 188 are conducting. Besides, the circuit portions excluding both cross coils 11 and 12, the car speed sensor 30 and the capacitor 50*f* in FIG. 1 are formed of semiconductor integrated circuits.

In the present embodiment structured as described above, when the vehicle concerned is in a travelling state, the car speed sensor 30 generates pulse signals in consecutive order in response to an actual speed of the vehicle, and the first stage waveform shaper 40*a* shapes the waveform of each pulse signal from the car speed sensor 30 in consecutive order so as to generate them as rectangular pulses (see FIG. 8(A)) and applies these pulses to the second stage waveform shaper 40*b*.

Then, in the second stage waveform shaper 40*b*, the analog switch 41 repeats opening and closing in response to rise and fall of respective rectangular pulses from the first stage waveform shaper 40*a*, and repeats charge and discharge of the capacitor 42 through collaboration of both constant current sources $I_{c1}$ and $I_{c2}$. As a result, the terminal voltage $V_K$ of the capacitor 42 changes as shown in FIG. 8(B). Then, respective comparators 44 and 45 generate comparison signals in accordance with the terminal voltage $V_K$ from the capacitor 42 and generate gate signals (refer to FIG. 8(C)) in consecutive order from the NOR gate 46 and applies them to the F-V converter 50 in relation to respective divided voltages $V_L$ and $V_H$ from the voltage dividing circuit 43.

Further, in the current smoothing circuit 50*a* of the F-V converter 50, the analog switch 52 repeats closing and opening in response to rise and fall of respective gate signals from the NOR gate 46 through the buffer 51, and repeats charge and discharge of the capacitor 53*a* through collaboration of the constant the capacitor 53*a* generates a ripple voltage Vf such as shown in FIG. 8(D). At this time, it is assumed that the capacitor 50*f* generates the hold voltage $V_D$.

Next, in the comparison circuit 50*b*, the comparator 54*c* compares the ripple voltage Vf from the current smoothing circuit 50*a* with a voltage sum of the hold voltage $V_D$ from the capacitor 50*f* and the offset voltage $\Delta V_1$ from the offset d.c. power source 54*a*, and the comparator 54*d* also compares a voltage sum of the ripple voltage Vf from the current smoothing circuit 50*a* and the offset voltage $\Delta V_2$ from the offset d.c. power source 54*b* with the hold voltage $V_D$ from the capacitor 50*f*.

In such a case, when the vehicle concerned is in a travelling state at an almost constant low car speed, the analog switch 56 repeats closing in response to the rise of respective gate signals from the NOR gate 46 of the second stage waveform shaper 40*b* so as to repeat charging of the capacitor 50*f*. Further, when the comparator 54*d* generates a comparison signal at a low level every time when $V_D \geq (Vf + \Delta V_2)$ is effected, the analog switch 57 is closed repeatedly in response to respective comparison signals, thereby to discharge the capacitor 50*f* repeatedly. As a result, the hold voltage $V_D$ is obtained as a waveform having smaller ripples as shown in FIG. 8(E).

Figure 11A:
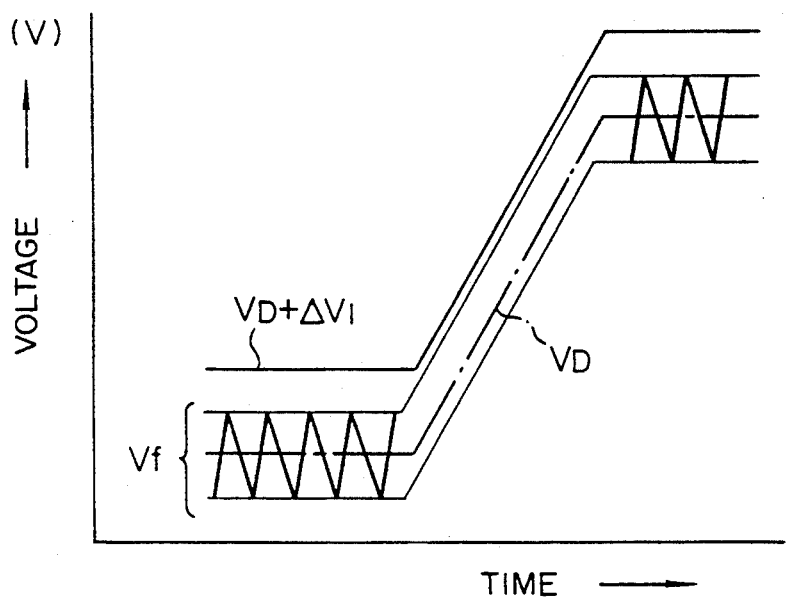
FIG. 11A is a diagram showing the change of the hold voltage at the time of acceleration of a vehicle.

Further, when the vehicle concerned is in an accelerating state at a low car speed, the comparator 54*c* generates a comparison signal having a low level so as to close the analog switch 58 when $(V_D + \Delta V_1) \leq Vf$ is effected with the increase of the ripple voltage Vf from the current smoothing circuit 50*a*. As a result, the charging circuit 50*e* applies a constant current to the capacitor 50*f* from the constant current source $I_{c6}$ through the analog switch 58. With this, the capacitor 50*f* is charged rapidly by the charging circuit 50*e*, thus increasing the hold voltage $V_D$ following in the wake of the ripple voltage Vf with high responsibility while restraining the ripple to the minimum as shown in FIG. 11A.

Figure 11B:
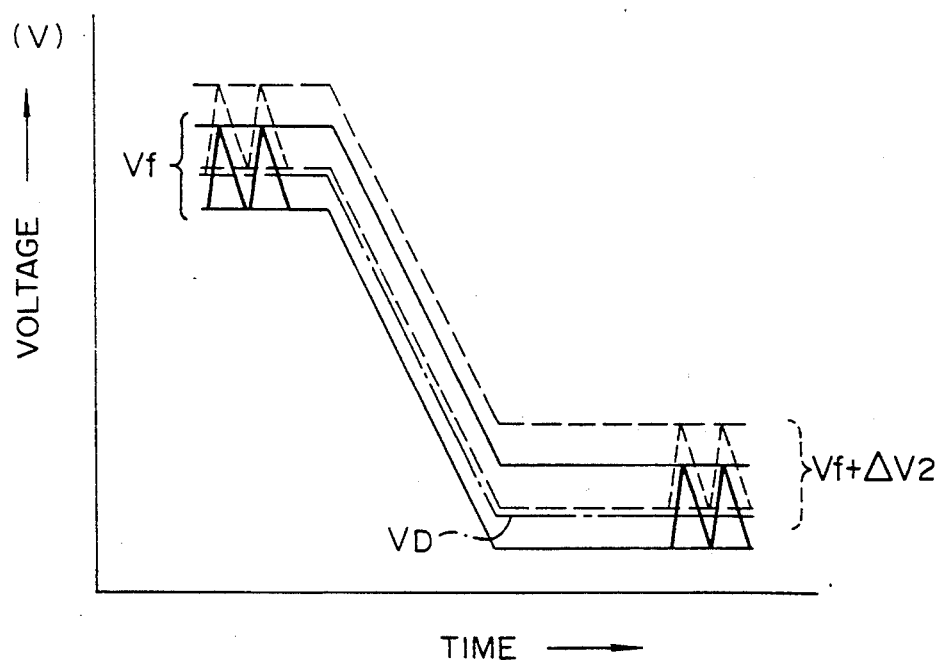
FIG. 11B is a diagram showing the change of the hold voltage at the time of deceleration of the vehicle.

Further, when the vehicle concerned is in a decelerating state at a low car speed, the comparator 54*d* generates a comparison signal of a low level so as to close the analog switch 57 when $(Vf + \Delta V_2) \leq V_D$ is effected with the decrease of the ripple voltage Vf from the current smoothing circuit 50*a*. As a result, the discharging circuit 50*d* has the capacitor 50*f* discharged through the analog switch 57 and the constant current source $I_{c5}$. With this, the hold voltage $V_D$ of the capacitor 50*f* drops rapidly following in the wake of the ripple voltage Vf with high responsibility as shown in FIG. 11B under a constant current from the constant current source $I_{c5}$ while restraining the ripple to the minimum.

As described above, even in a state that the car speed of the vehicle concerned is low, respective rectangular pulses from the first stage waveform shaper 40*a* are converted into a ripple voltage Vf proportional to the frequency proportional to the car speed by means of the second stage waveform shaper 40*b* and the F-V converter 50. The ripple voltage Vf is converted into a hold voltage $V_D$ with restrained ripples as described above, and the hold voltage $V_D$ is made to change following in the wake of the ripple voltage Vf, i.e., the change of a low car speed with high responsibility. The fact means that, even if the vehicle concerned is in a low car speed state, an analog voltage having a frequency proportional to the car speed of that vehicle can be realized with a hold voltage having less ripples and good responsibility.

Further, when the mean voltage of the ripple voltage Vf becomes less than ½ of the upper limit value of the ripple width, the low frequency cutoff circuit 50 g cuts off the hold voltage $V_D$ in a low frequency range by lowering it to zero(V). thus, the regression error in the low frequency range can be restrained to the minimum. Besides, it is assumed that, when the car speed of the vehicle concerned (hereinafter referred to as a car speed V) increases from V=0 (Km/h) to V=300 (Km/h), the analog voltage $V_D$ changes from $V_D = 0$ (V) to $V_D = 2$ (V).

When the hold voltage $V_D$ is produced as an analog voltage (hereinafter referred to as an analog voltage $V_D$) from the F-V converter 50 as described above, respective current generators 80 and 90 generate respective sawtooth currents $I_1$ and $I_2$ (FIG. 12A, FIG. 12B) in accordance with the change of the analog voltage $V_D$ through the collaboration of the reference voltage generator 60 and the comparison circuit 70. In such a case, the analog voltage $V_D$ is obtainable as a voltage having less ripples and good responsibility. Therefore, even when the vehicle concerned is in a low car speed state, respective sawtooth currents $I_1$ and $I_2$ can be materialized so as to show a current waveform having less ripples and good responsibility.

Then, the I-V converters 100 and 110 convert currents $I_1$ and $I_2$ from respective current generators 80 and 90 into triangular wave voltages $V_1$ and $V_2$ (see FIGS. 13A and 13B), respective function generators 120 and 130 generate respective function voltages $V_{g1}$ and $V_{g2}$ (see FIGS. 13C and 13D) in accordance with respective triangular wave voltages $V_1$ and $V_2$, and respective function generators 140 and 150 generate function voltages $V_{h1}$ and $V_{h2}$ (see FIGS. 13E and 13F) in accordance with function voltages $V_{g1}$ and $V_{g2}$, respectively.

In such a case, the analog voltage $V_D$ is obtainable as a voltage having less ripples and good responsibility as described above. Therefore, even if the vehicle concerned is in a low car speed state, respective triangular wave voltages $V_1$ and $V_2$, respective function voltages $V_{g1}$ and $V_{g2}$ and respective function voltages $Vh_1$ and $Vh_2$ can be realized so as to show a voltage waveform having less ripples and good responsibility.

Further, when the output direction switch 160 generates the first and the second output direction change-over signals on the lines $K_1$ and $K_2$ in accordance with the voltages corresponding to respective currents $I_1$ and $I_2$ from the current generators 80 and 90 through the collaboration of the comparison circuit 70, both transistors 171 and 172 become conducting in a state that the transistors 174 and 175 are non-conducting in the driving circuit 170 when the first output direction change-over signal from the output direction switch 160 is at a low level. As a result, a current corresponding to (function voltage $Vh_1$/resistance value of resistance 173) flows into the resistance 173 from the d.c. power source through the transistor 171, the cross coil 11 and the transistor 172 through the collaboration of the function generator 140 and the resistance 173 by the operational amplifier 176.

On the other hand, when the first output direction change-over signal from the output direction switch 160 is at a high level, both transistors 174 and 175 become conducting while both transistors 171 and 172 are non-conducting. As a result, a current corresponding to (function voltage $Vh_1$/resistance value of resistance 173) flows into the resistance 173 from the d.c. power source through the transistor 175, the first cross coil 11 and the transistor 174 through the collaboration of the second stage function generator 140 and the resistance 173 by the operational amplifier 176. In such a case, the analog voltage $V_D$ is obtainable as a voltage having less ripples and good responsibility. Therefore, even if the vehicle concerned is in a low car speed state, the inflow current can be realized so as to show a current waveform having less ripples and good responsibility.

On the other hand, in the driving circuit 180 of the second channel for the second cross coil 12, both transistors 181 and 182 become conducting while both transistors 184 and 185 are non-conducting when the second output direction change-over signal from the output direction change-over switch 160 through the line $K_2$ is at a low level. As a result, a current corresponding to (function voltage $Vh_2$/resistance value of resistance 183) flows into the resistance 183 from the d.c. power source through the transistor 181, the second cross coil 12 and the transistor 182 through the collaboration of the function generator 150 and the resistance 183 by the operational amplifier 186.

On the other hand, when the second output direction change-over signal from the output direction change-over switch 160 is at a high level, both transistors 184 and 185 become conducting in a state that both transistors 181 and 182 are non-conducting. As a result, a current corresponding to (function voltage $Vh_2$/resistance value of resistance 183) flows into the resistance 183 from the d.c. power source through the transistor 185, the cross coil 12 and the transistor 184 through the collaboration of the second stag function generator 150 and the resistance 183 by the operational amplifier 186. In such a case, the analog voltage $V_D$ is obtainable as a voltage having less ripples and good responsibility as described above. Therefore, even when the vehicle concerned is in a low car speed state, the inflow current into the resistance 183 can be realized as one that has a current waveform having less ripples and good responsibility.

Figure 14:
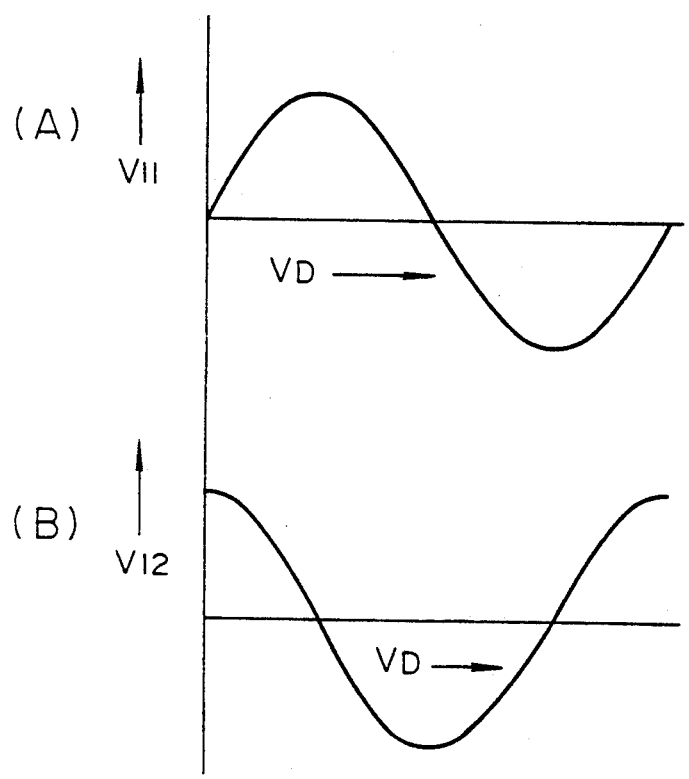
FIG. 14 shows terminal voltage waveform diagrams of two cross coils.

The foregoings mean that respective terminal voltages $V_{11}$ and $V_{12}$ of both cross coils 11 and 12 change in such waveforms as shown in FIGS. 14 (A) and (B) in accordance with the analog voltage $V_D$. In such a case, the analog voltage $V_D$ is obtainable as a voltage having less ripples and good responsibility. Therefore, even when the vehicle concerned is in a low car speed state, respective terminal voltages $V_{11}$ and $V_{12}$ can be realized as one that has a voltage waveform having less ripples and good responsibility.

Figure 12A:
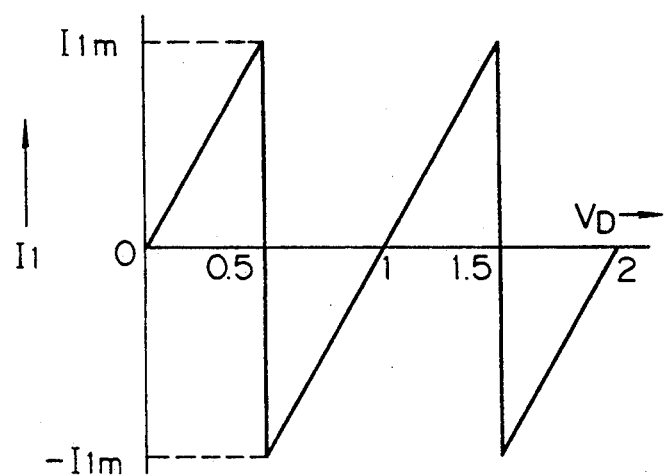
FIG. 12A is an output waveform diagram of a sawtooth current generator of a first channel.
Figure 12B:
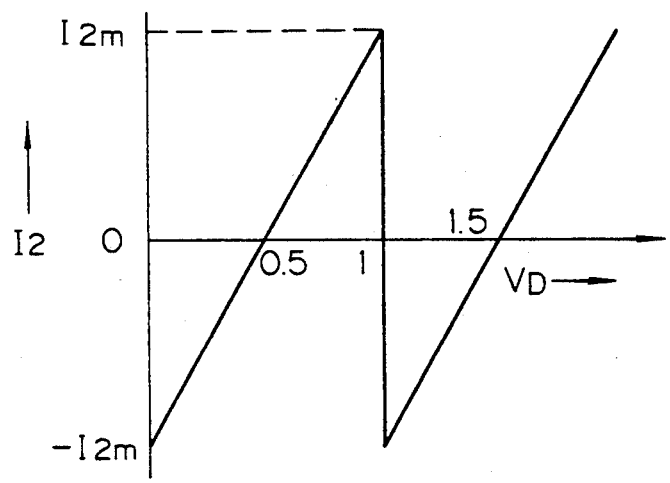
FIG. 12B is an output waveform diagram of a sawtooth current generator of the second channel.
Figure 13A:
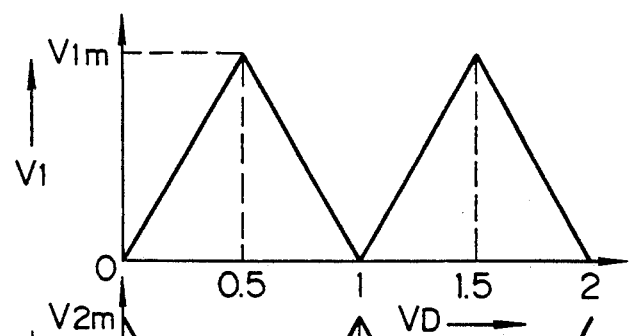
FIG. 13A is a diagram showing an output of a current-voltage converter of the first channel.
Figure 13B:
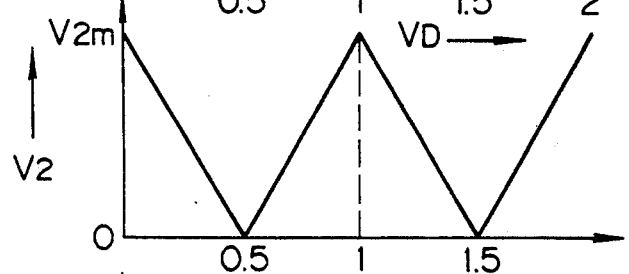
FIG. 13B is a diagram showing an output of a current-voltage converter of the second channel.

In other words, respective currents $I_1$ and $I_2$ change in a sawtooth waveform with phases being different by 90° (equivalent to $V_D=0.5$ (V)) from each other as shown in FIG. 12A and FIG. 12B, and respective voltages $V_1$ and $V_2$ change in a triangular waveform with phases being different by 90° from each other as shown in FIG. 13A and FIG. 13B.

Figure 13C:
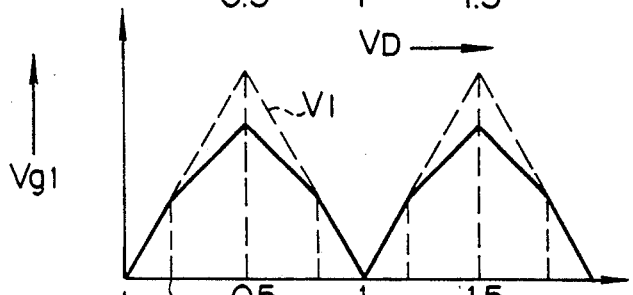
FIG. 13C is a diagram showing an output of a first function generator of the first channel.
Figure 13D:
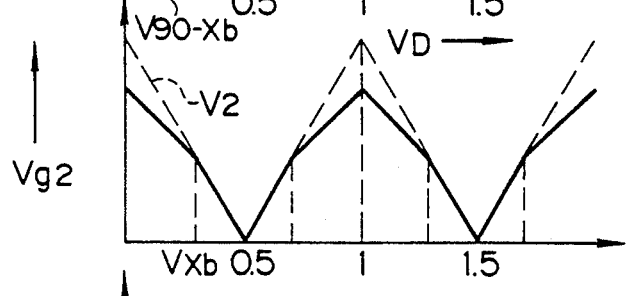
FIG. 13D is a diagram showing an output of a first function generator of the second channel.

Then, the function voltage $V_{g1}$ is formed by modifying the voltage $V_1$ so as to widen the vertical angle of the waveform of the voltage $V_1$ within $V_{90-xb} \leq V_D \leq (0.5+V_{90-xb})$ wherein $V_D=0.5$ (V) is as the center, and within $(1+V_{90-xb}) < V_D \leq (1.5+V_{90-xb})$ wherein $V_D=1.5$ (V) is as the center as shown in FIG. 13C. On the other hand, the function voltage $V_{g2}$ is formed by modifying the voltage $V_2$ so as to widen the vertical angle of the waveform of the voltage $V_2$ within $0 \leq V_D \leq V_{xb}$, within $(0.5+V_{xb}) \leq V_D \leq (1+V_{xb})$ with $V_D=1$ (V) as the center, and within $(1.5+V_{xb}) \leq V_D \leq 2$ (V) as shown in FIG. 13D.

Figure 13E:
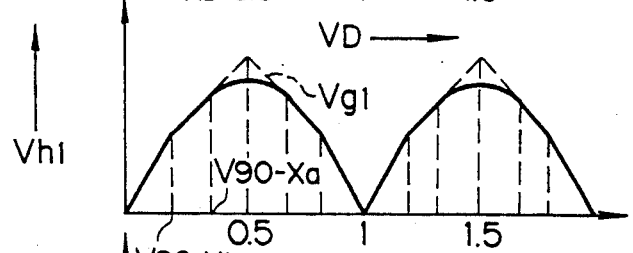
FIG. 13E is a diagram showing an output of a second function generator of the first channel.
Figure 13F:
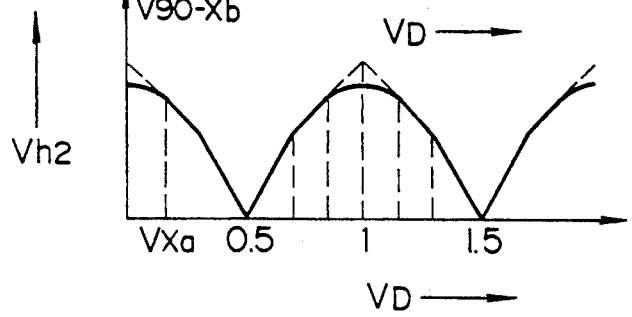
FIG. 13F is a diagram showing an output of a second function generator of the second channel.

Furthermore, the function voltage $Vh_1$ is formed by modifying the function voltage $V_{g1}$ so as to make the waveform of the function voltage $V_{g1}$ almost flat within $V_{90-xa} \leq V_D \leq (0.5+V_{90-xa})$ wherein $V_D=0.5$ (V) is as the center and within $(1+V_{90-xa}) \leq V_D \leq (0.5+V_{90-xa})$ where $V_D=1.5$ (V) is as the center as shown in FIG. 13E. On the other hand, the function voltage $Vh_2$ is formed by modifying the function voltage $V_{g2}$ so as to make the waveform of the function voltage $V_{g2}$ almost flat in respective ranges of $0 \leq V_D \leq V_{xa}$, $(1-V_{xa}) \leq V_D \leq (1+V_{xa})$ and $(2-V_{xa}) \leq V_D \leq 2$ (V) as shown in FIG. 13F.

As a result, the terminal voltage $V_{11}$ of the cross coil 11 shows a pseudo sine waveform as shown in FIG. 14(A), while the terminal voltage $V_{12}$ of the second cross coil 12 shows a pseudo cosine waveform as shown in FIG. 14(B). In such a case, respective terminal voltages $V_{11}$ and $V_{12}$ change gradually resulting from the above-described analog circuit structure.

Thus, the pointer 14 deflects in accordance with the change of the car speed V in relation to electromagnetic forces produced in respective cross coils 11 and 12 in accordance with respective terminal voltages $V_{11}$ and $V_{12}$ described above. As a result, it is possible to expedite dissolution of a sense of incompatibility on deflecting condition of the pointer 14. In such a case, the F-V conversion output of the F-V converter 50 is obtainable as a value having less ripples and good responsibility to the car speed no matter how the vehicle concerned changes in a low car speed state. Therefore, it is possible to have the pointer 14 deflect under a deflecting condition having good responsibility while dissolving the pointer deflection phenomenon even in a low car speed region. Further, in the F-V converter 50, it is sufficient only to add the capacitor 50f as an outside capacitor without depending on a digital circuit as compared with a conventional circuit structure. Hence, it is possible to restrain cost increase of an apparatus of this type to the minimum.

Figure 15A:
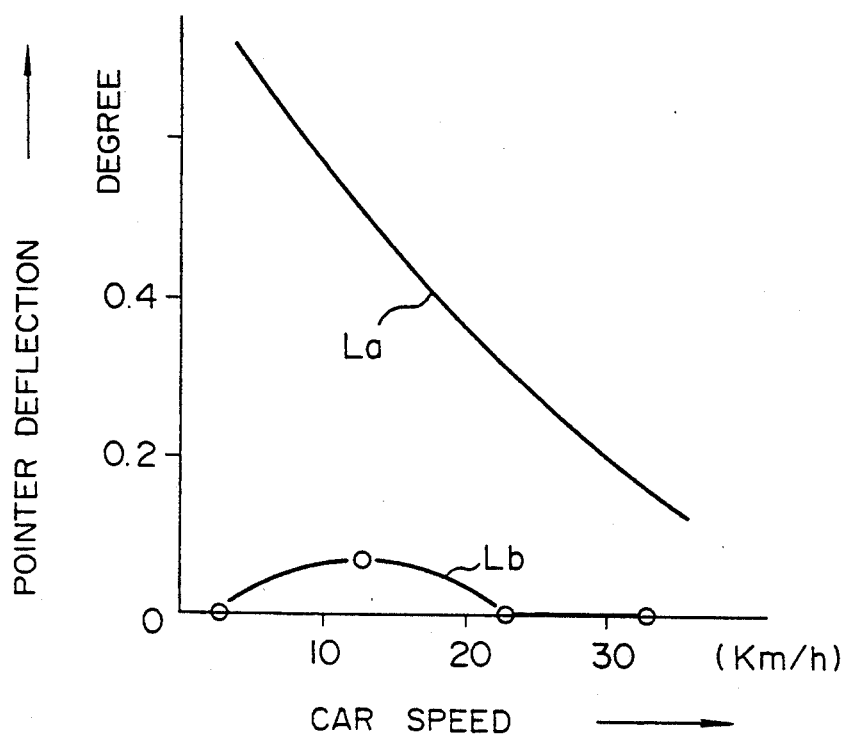
FIG. 15A is a diagram showing the pointer deflection characteristic in a low speed region of the vehicle.
Figure 15B:
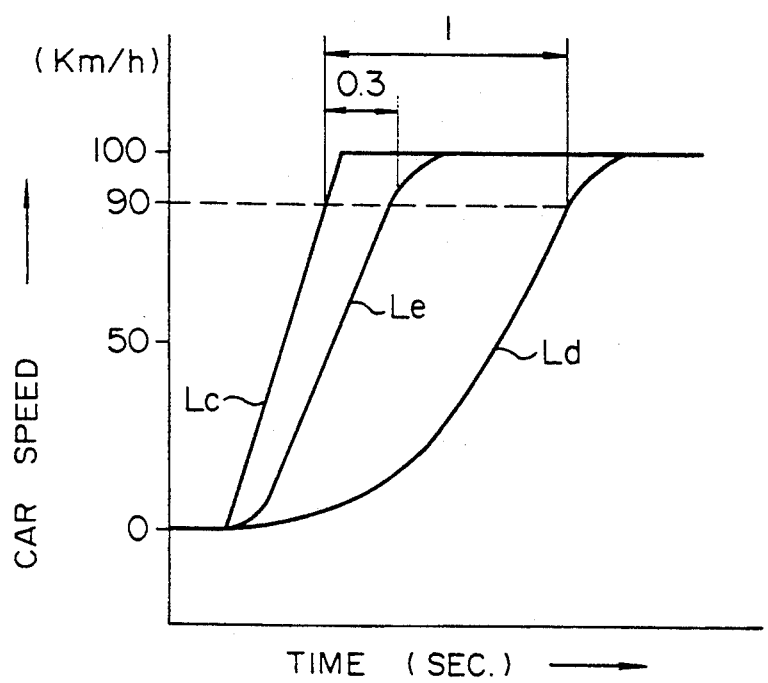
FIG. 15B is a diagram showing responsibility of the pointer to a car speed.

Incidentally, when the pointer deflection phenomenon and the responsibility of indication were confirmed through experiments in case the pointer 14 was deflected by a conventional driving apparatus and the driving apparatus D of the present invention, the results shown in FIG. 15A and FIG. 15B were obtained. In FIG. 15A, a curve La shows pointer deflection characteristic of the pointer 14 in accordance with a low car speed by means of a conventional driving apparatus, and a curve Lb shows pointer deflection characteristic of the pointer 14 in accordance with a low car speed by means of the driving apparatus D of the present embodiment. Further, in FIG. 15B, a curve Lc shows a characteristic showing a change of the car speed V with the passage of time, a curve Ld shows indication responsibility of the pointer 14 to the car speed by a conventional driving apparatus, and a curve Le shows indication responsibility to the car speed of the pointer 14 by the driving apparatus D of the present embodiment.

Further, according to FIG. 15A, it is noticed that the pointer deflection of the pointer 14 by the driving apparatus D of the present embodiment is remarkably smaller than the pointer deflection of the pointer 14 by a conventional driving apparatus. Further, it is also noticed according to FIG. 15B that the indication responsibility of the pointer 14 by the driving apparatus D of the present embodiment has been improved greatly as compared with the indication responsibility of the pointer 14 by a conventional driving apparatus.

Figure 16:
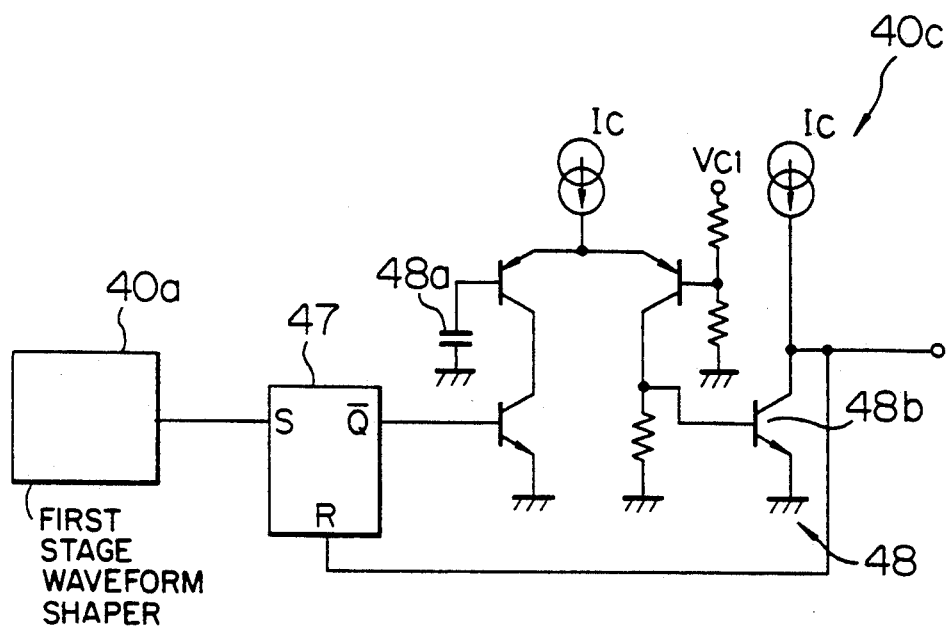
FIG. 16 is a circuit diagram showing a partial modification of the above-mentioned embodiment.

In the next place, a modification of the above-mentioned embodiment will be described. The modification is characterized in adopting a waveform shaper 40c as shown in FIG. 16, in place of the second stage waveform shaper 40b described in the above-mentioned embodiment. In this waveform shaper 40c, a transistor circuit 48 operates so as to charge a capacitor 48a thereof and make a transistor 48b non-conducting by an inverted output of an RS flip-flop 47 responding to each rise of the rectangular pulses (see FIG. 18(A)) from the first stage waveform shaper 40a and also discharge the capacitor 48a and make the transistor 48b conducting by the inverted output of the RS flip-flop 47 responding to each fall of the rectangular pulses from the first stage waveform shaper 40a.

Figure 18:
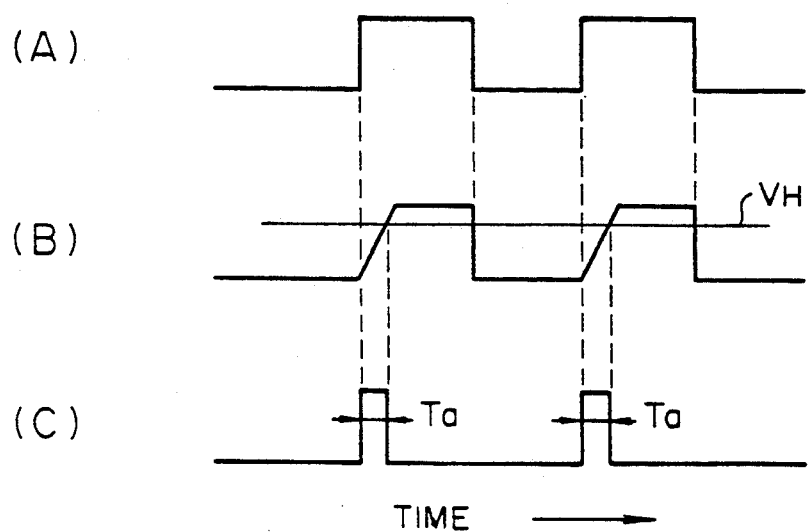
FIG. 18 shows output waveform diagrams of respective principal components in the first modification of the above-mentioned embodiment.

As a result, the terminal voltage of the capacitor 48a changes in a voltage waveform shown in FIG. 18(B), and the collector voltage of the transistor 48b changes in a voltage waveform shown in FIG. 18(C). This fact means that the collector voltage of the transistor 48b has the same waveform as that of the output of the NOR gate of the second stage waveform shaper 40b described in above-mentioned embodiment. In this case, it is arranged so that the time constant at time of discharge of the capacitor 48a is made larger at time of constant car speed and smaller at time of sudden speed adjustment.

Figure 17A:
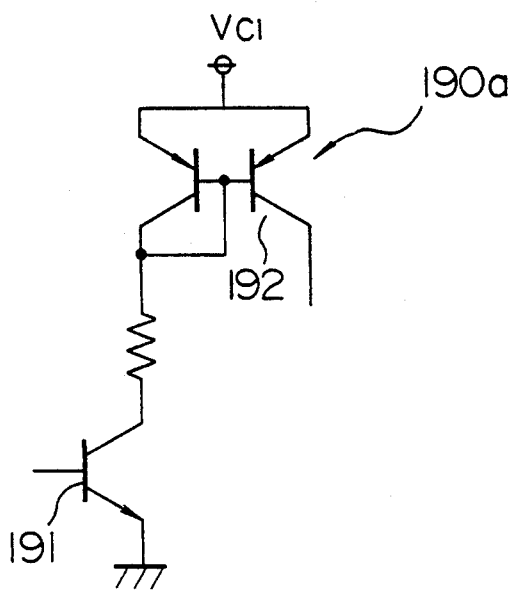
FIG. 17A is a circuit diagram of another partial modification.

Besides, in embodying the present invention, a bipolar transistor circuit 190a consisting of combination of an outflow type constant current circuit and a switching element such as shown in FIG. 17A may be adopted in place of a series circuit of an analog switch and a constant current source applying a constant current thereto as of the first embodiment, e.g., the analog switch 52 and the constant current source $Ic_3$. In this case, when a transistor 191 functioning as a switching element is made conducting, a constant current flows out of the collector of a transistor 192. Further, the constant current from the collector of the transistor 192 becomes zero when the transistor 191 is made non-conducting.

Figure 17B:
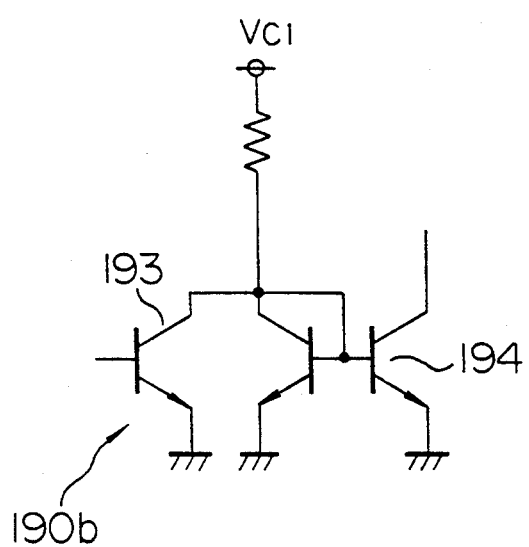
FIG. 17B is a circuit diagram of still another partial modification.

Further, in embodying the present invention, a bipolar transistor circuit 190b consisting of combination of an inflow type constant current circuit and a switching element such as shown in FIG. 17B may be adopted in place of a series circuit of an analog switch and a constant current source flowing out a constant current therethrough as of the first embodiment, e.g., the analog switch 57 and the constant current source $Ic_5$. In this case, when a transistor 193 functioning as a switching element is made non-conducting, a constant current flows into the collector of a transistor 194. Further, the constant current flowing into the collector of the transistor 194 becomes zero when the transistor 193 is made conducting. The present invention may be applied not only to the car speed V, but also to a driving apparatus for a cross coil type analog indicating instrument indicating a variety of analog inputs such as a tachometer, an oil gauge, a fuel gauge, a thermogauge and an oil pressure gauge.

Further, the present invention may be applied in forming a pseudo sine wave or a pseudo cosine wave from a triangle wave or a trapezoidal wave for instance in place of forming a pseudo sine wave and a pseudo cosine wave from a sawtooth current.

Further, a bridge circuit structure has been adopted for respective driving circuits 170 and 180 in above-mentioned embodiments, but the output direction switch 160 may be omitted in case such a bridge circuit structure is not adopted.

What is claimed is:

1. A driving apparatus for an analog instrument having a pointer that indicates a process quantity by deflecting through an angle in response to driven cross coils, said driving apparatus comprising:
   pulse signal generating means for generating a pulse signal at a frequency proportional to said process quantity;
   frequency-voltage conversion means connected tot he pulse signal generating means for generating an analog voltage proportional to the frequency of said pulse signal; and
   driving means connected to the frequency-voltage conversion means for driving said cross coils in accordance with said analog voltage;
   wherein said frequency-voltage conversion means comprises:
   voltage generating means connected to said pulse signal generating means for generating a ripple voltage proportional to the frequency of said pulse signal, said ripple voltage having ripple-voltage ripple;
   a hold means for generating the analog voltage; and
   voltage control means connected to said voltage generating means and to said hold circuit for controlling said controllable circuit so that the analog voltage tracks said ripple voltage with an amount of analog-voltage ripple less than said ripple-voltage ripple.

2. A driving apparatus according to claim 1 wherein said voltage generating means comprises:

a first stage waveform shaper connected to said pulse signal generating means for generating a rectangular pulse signal by shaping said pulse signal;

a second waveform shaper connected to said first waveform shaper for generating a gate signal having pulse times corresponding to rising and falling transitions of said pulse signal; and a frequency-voltage converter connected to said second waveform shaper for generating the ripple signal having a ripple proportional to the frequency of said pulse signal.

3. A driving apparatus according to claim 2, wherein said second stage waveform shaper comprises:

a first constant current source for supplying a first constant current;

a second constant current source for supplying a second constant current having a polarity opposite to that of said first constant current and an absolute value approximately half of that of said first constant current;

an analog switch for receiving said rectangular pulse signal and making and breaking said second constant current in accordance with said rectangular pulse signal;

a capacitor, having a first and a second terminals, connected to ground at the first terminal and connected to said first constant current source and to said second constant current source through said analog switch at the second terminal; and comparators having two thresholds on different levels connected to said second terminal of the capacitor, comparing potential of said second terminal with said thresholds and providing a pulse signal when said potential lies between said thresholds.

4. A driving apparatus according to claim 2, wherein said second stage waveform shaper comprises:

a constant current source for supplying a first constant current;

an outflow type constant current circuit for supplying a second constant current;

a switching element connected to said outflow type constant current circuit for receiving said rectangular pulse signal and making and breaking said second constant current in accordance with said rectangular pulse signal;

a capacitor, having a first and a second terminals, connected to ground at the first terminal and connected to said first constant current source and to a second constant current source through said analog switch at the second terminal;

comparators having two thresholds on different levels connected to said second terminal of the capacitor, comparing potential at said second terminal with said thresholds, and providing a pulse signal when said potential lies between said thresholds.

5. A driving apparatus according to claim 4, wherein said switching element is connected in series with said outflow type constant current circuit.

6. A driving apparatus according to claim 4, wherein said switching element is connected in parallel with said outflow type constant current circuit.

7. A driving apparatus according to claim 1, wherein said voltage generating means comprises:

a first stage waveform shaper for receiving said pulse signal and generating a rectangular pulse signal by shaping the waveform of said pulse signal;

a second stage waveform shaper for receiving said rectangular pulse signal and generating a gate signal having a pulse corresponding to one of rise and fall of said pulse signal; and a frequency-voltage converter for receiving said gate signal and generating a ripple signal corresponding to said gate signal.

8. A driving apparatus according to claim 1, wherein said frequency-voltage conversion means further comprises low frequency cut-off means having a reference voltage lower than the upper limit value of the ripple voltage and discharging said held voltage when a mean voltage of said ripple voltage reaches to said reference voltage or lower.

* * * * *